(12) United States Patent
Nakamura

(10) Patent No.: US 7,512,430 B2
(45) Date of Patent: Mar. 31, 2009

(54) ELECTROMAGNETIC WAVE SHIELD BOX

(75) Inventor: Katsushi Nakamura, Atsugi (JP)

(73) Assignee: Anritsu Corporation, Atsugi-shi, Kanagawa-ken (JP)

( * ) Notice: Subject to any disclaimer, the term of this patent is extended or adjusted under 35 U.S.C. 154(b) by 543 days.

(21) Appl. No.: 11/403,806

(22) Filed: Apr. 14, 2006

(65) Prior Publication Data

US 2006/0232491 A1    Oct. 19, 2006

(30) Foreign Application Priority Data

Apr. 18, 2005    (JP)    ............................. 2005-119767
Mar. 16, 2006    (JP)    ............................. 2006-073072

(51) Int. Cl.
     *H04M 1/00*    (2006.01)
(52) U.S. Cl. ................ 455/575.8; 455/90.3; 455/556.1; 343/702; 361/816
(58) Field of Classification Search ................ 455/90.3, 455/556.1, 575.1, 575.3, 575.8; 343/702; 361/816
See application file for complete search history.

(56) References Cited

U.S. PATENT DOCUMENTS

| | | | | |
|---|---|---|---|---|
| 6,360,105 | B2 * | 3/2002 | Nakada et al. | ............. 455/575.7 |
| 6,483,719 | B1 * | 11/2002 | Bachman | ..................... 361/816 |
| 6,657,214 | B1 | 12/2003 | Foegelle et al. | |
| 6,785,519 | B2 * | 8/2004 | Toyoda et al. | ............... 455/90.1 |
| 6,934,515 | B2 * | 8/2005 | Wallach | ..................... 455/67.13 |
| 6,934,517 | B2 * | 8/2005 | Fujihashi | ................... 455/90.1 |
| 6,947,000 | B2 * | 9/2005 | Ito | .............................. 343/702 |
| 7,164,898 | B2 * | 1/2007 | Hankui et al. | ................ 455/311 |
| 7,398,113 | B2 * | 7/2008 | Kozakai et al. | ........... 455/575.7 |
| 2002/0137475 | A1 * | 9/2002 | Shou et al. | ...................... 455/90 |
| 2004/0012529 | A1 | 1/2004 | Teshirogi et al. | |
| 2005/0037825 | A1 * | 2/2005 | Faranda et al. | ............ 455/575.9 |

FOREIGN PATENT DOCUMENTS

| | | |
|---|---|---|
| DE | 197 32 639 C1 | 1/1999 |
| DE | 299 23 548 U1 | 2/2001 |
| JP | H09-318689 | 12/1997 |
| JP | H10-282174 | 10/1998 |
| JP | H11-304866 | 11/1999 |
| JP | 2004-80271 | 3/2004 |
| WO | WO2005/055361 A1 | 6/2005 |

* cited by examiner

*Primary Examiner*—Nhan T Le
(74) *Attorney, Agent, or Firm*—Manabu Kanesaka

(57) ABSTRACT

Disclosed herein is an electromagnetic wave shield box for shielding a wireless terminal received therein from external electromagnetic waves. The electromagnetic wave shield box includes a box body for allowing the wireless terminal to be received therein, the box body having a coupling antenna mounted therein, the coupling antenna being spatially coupled with an antenna of the wireless terminal, a cover constructed to be openable and closable with respect to the box body, a reference table mounted at a predetermined position above the coupling antenna in the box body, the reference table having a reference surface, which is referenced when the wireless terminal is disposed thereon, a loading unit for allowing the wireless terminal to be loaded thereon, the loading unit being movable along the reference surface, and fixing means for detachably fixing the loading unit, on which the wireless terminal is loaded, to a predetermined position of the reference surface of the reference table to define the positional relation between the antenna of the wireless terminal and the coupling antenna.

7 Claims, 19 Drawing Sheets

[Fig. 1]
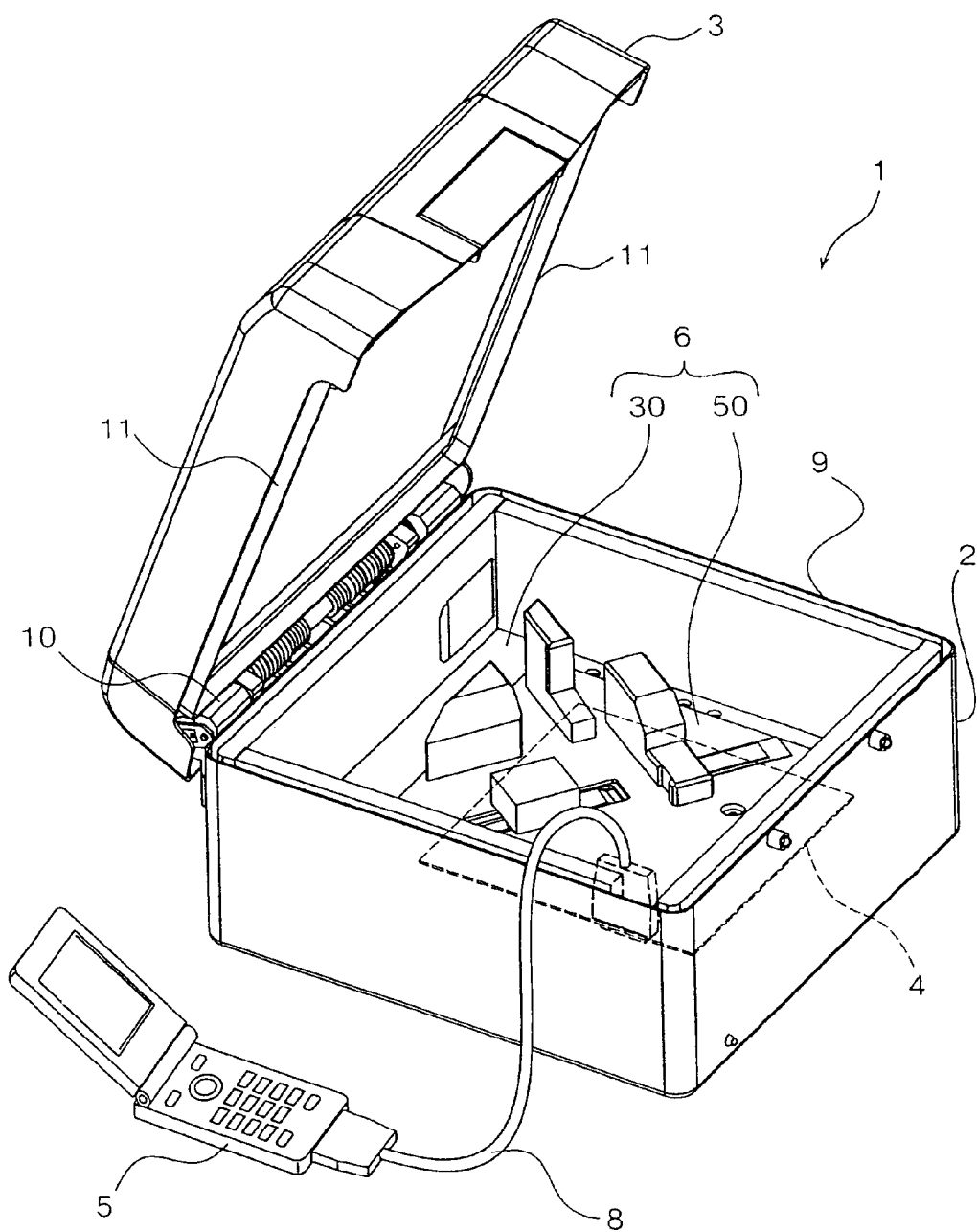

[Fig. 2]
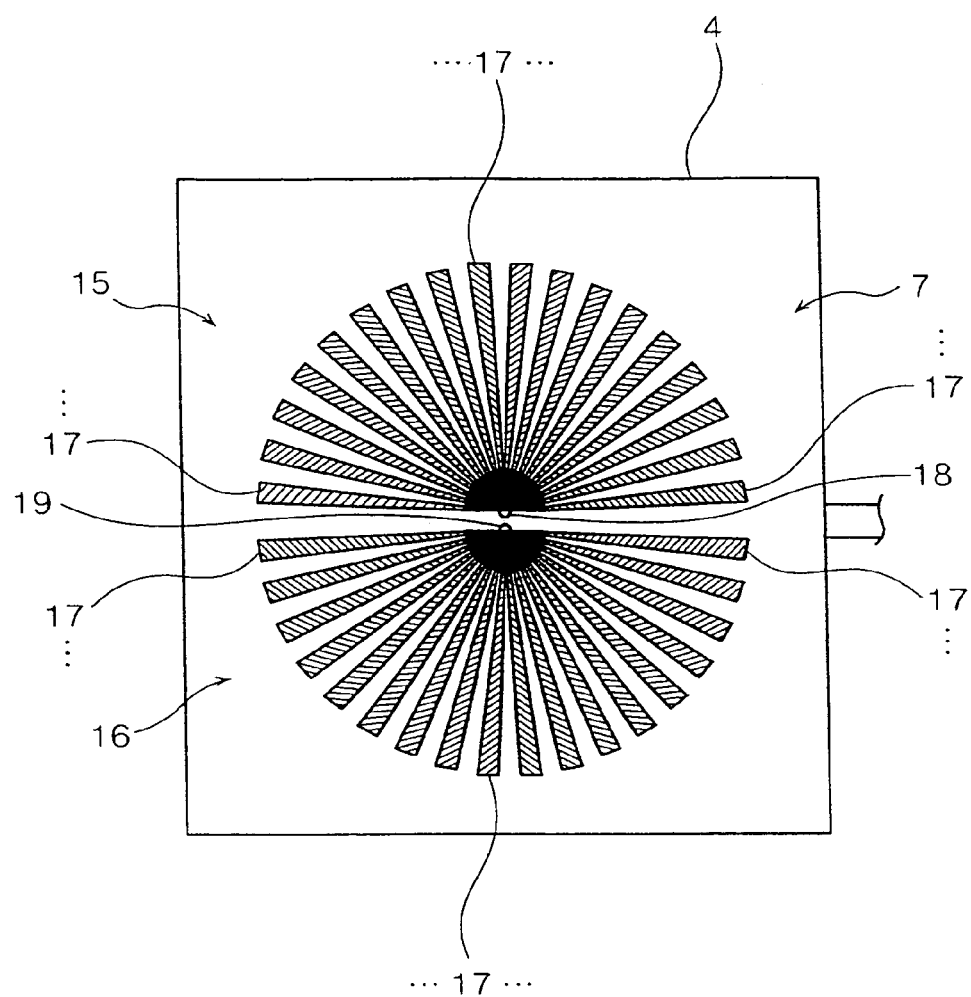

[Fig. 3]
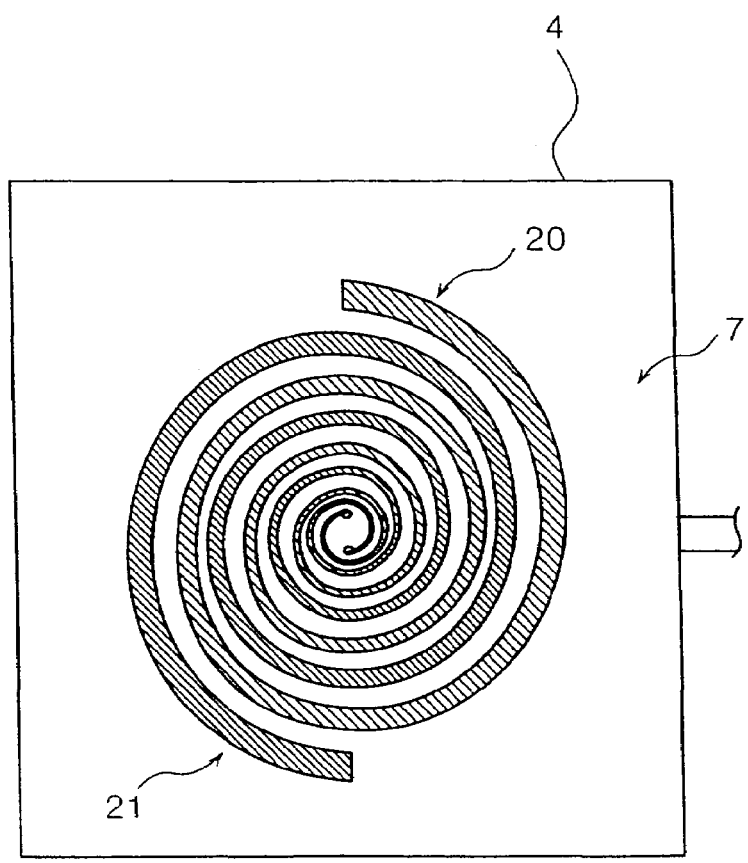

[Fig. 4]
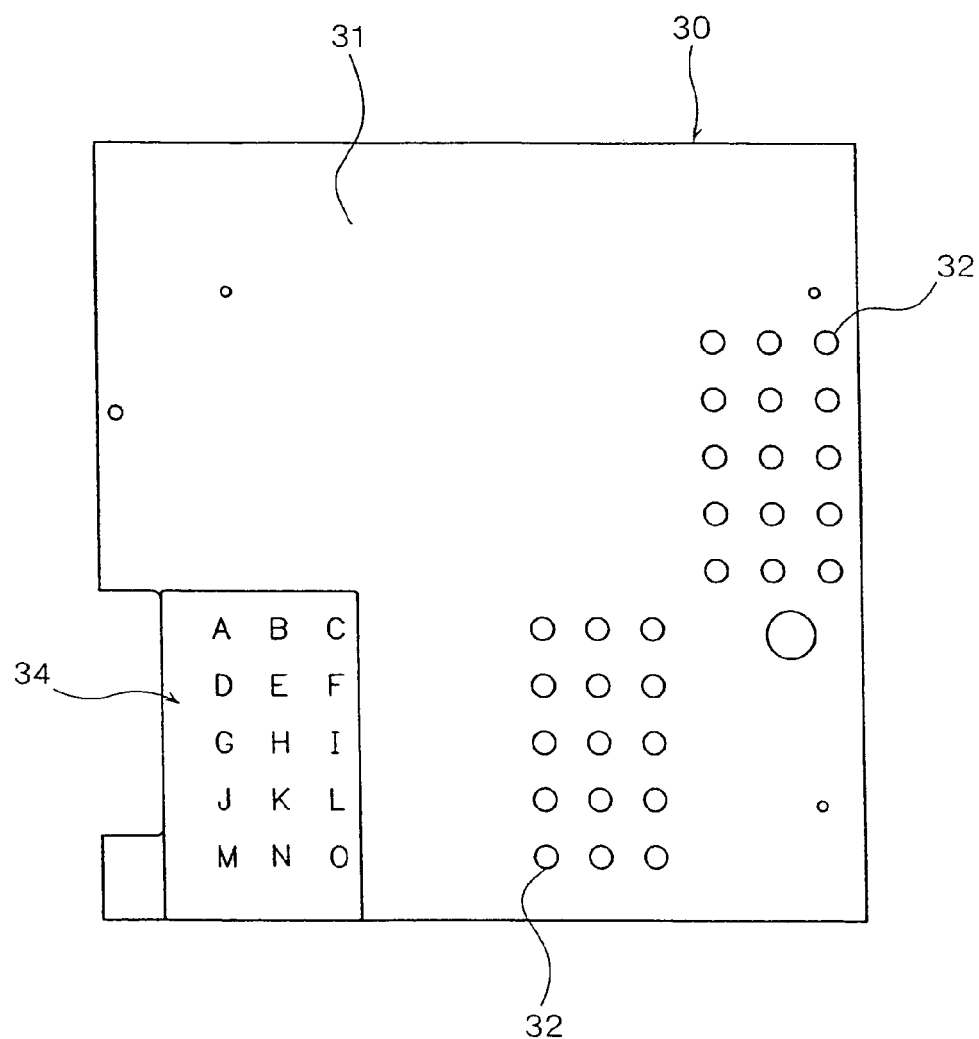

[Fig. 5]
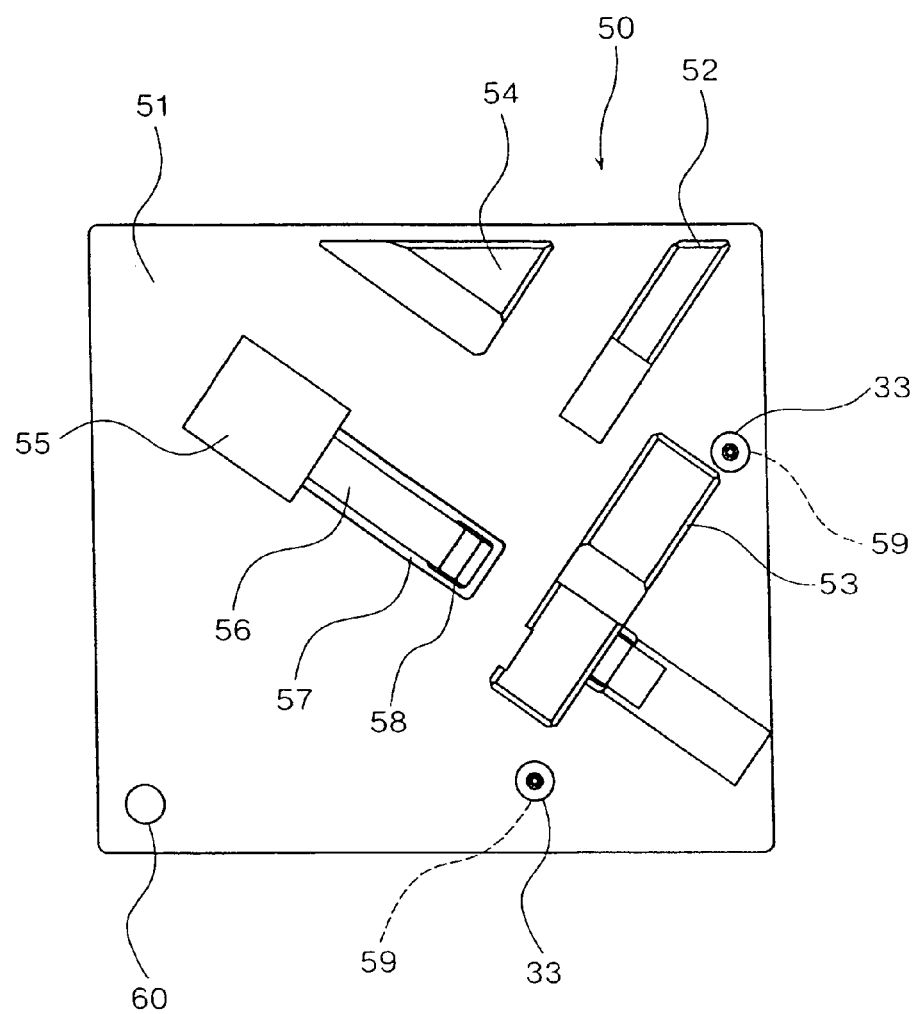

[Fig. 6]
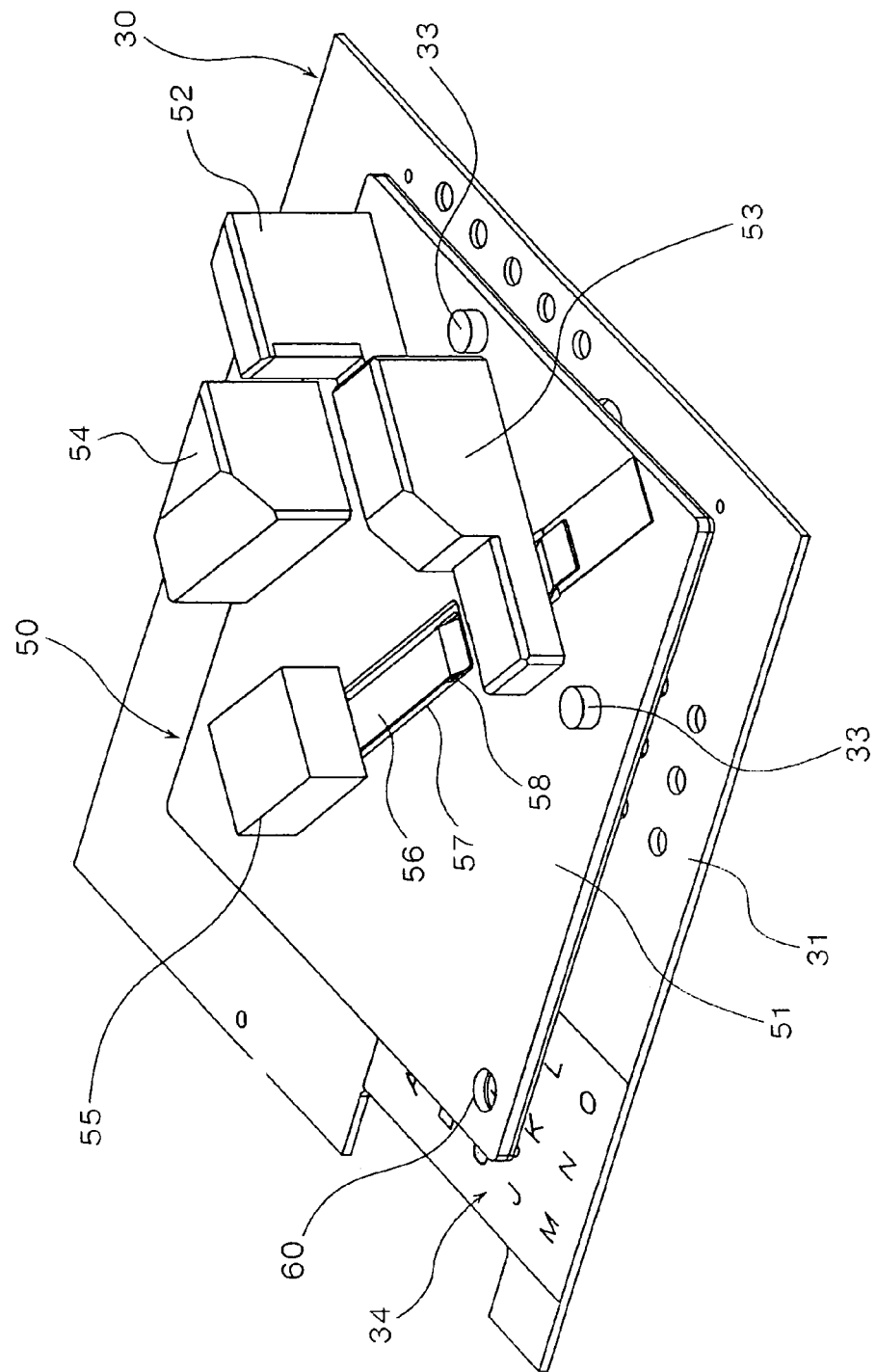

【Fig. 7】
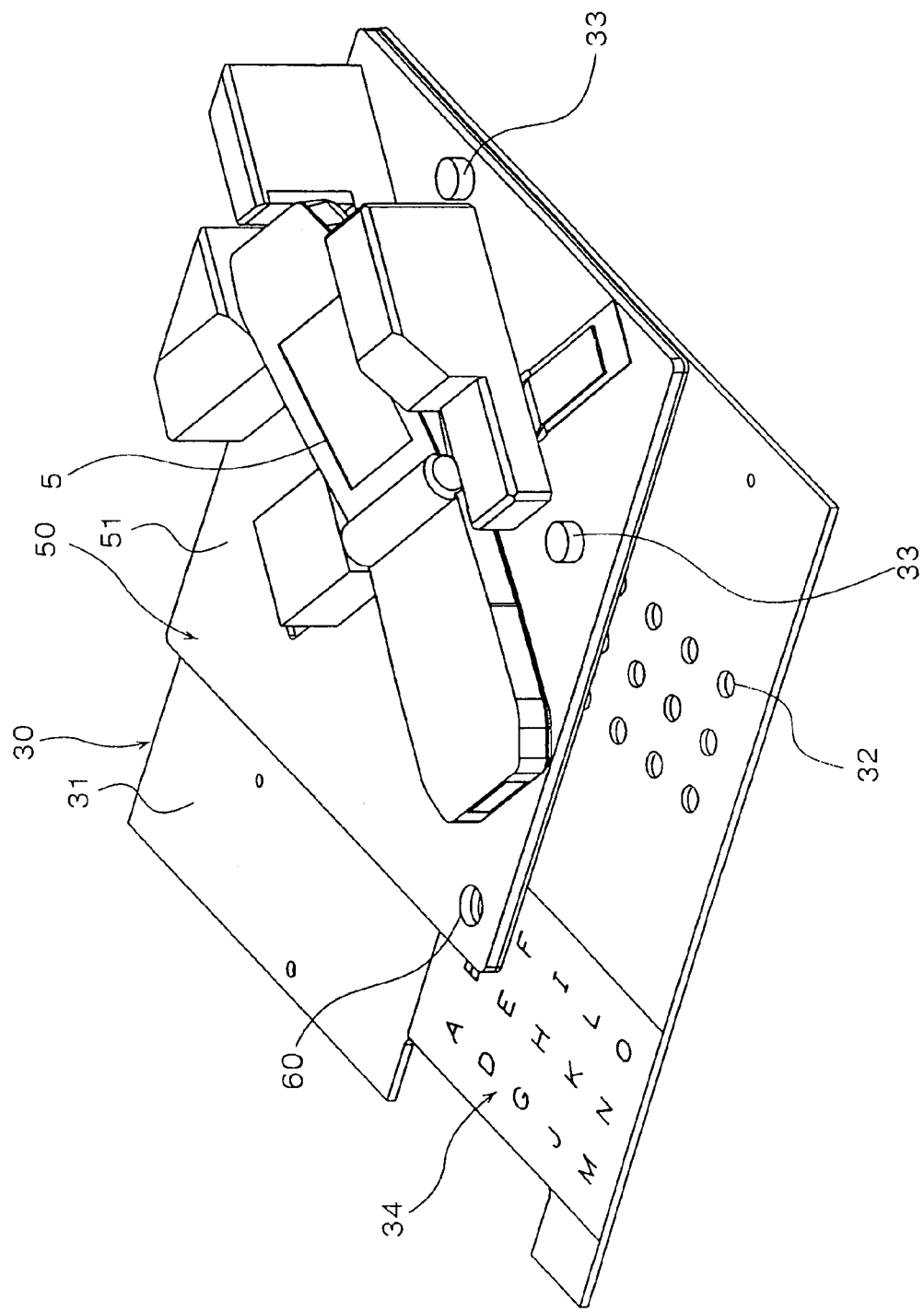

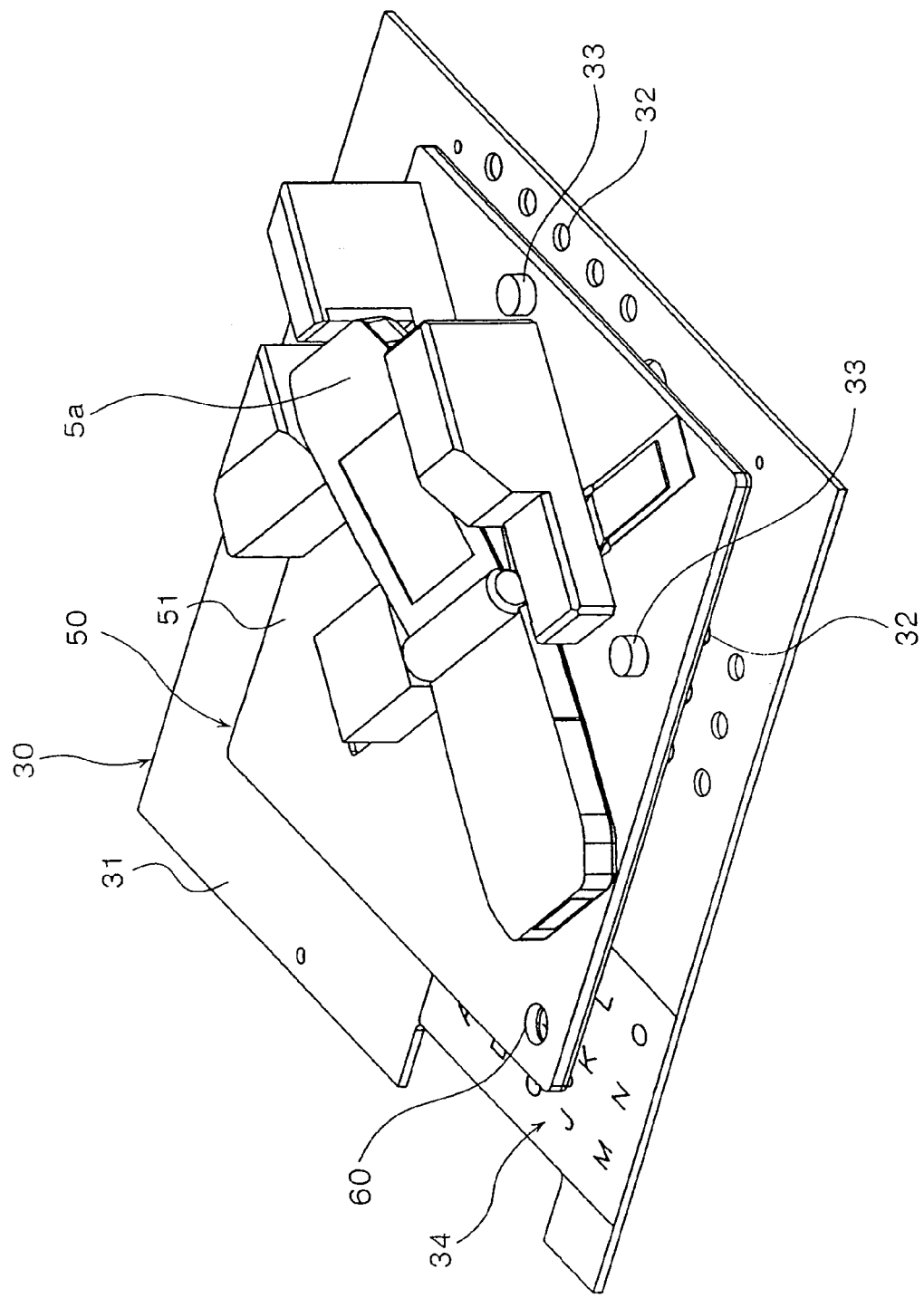
[Fig. 8]

[Fig. 9]
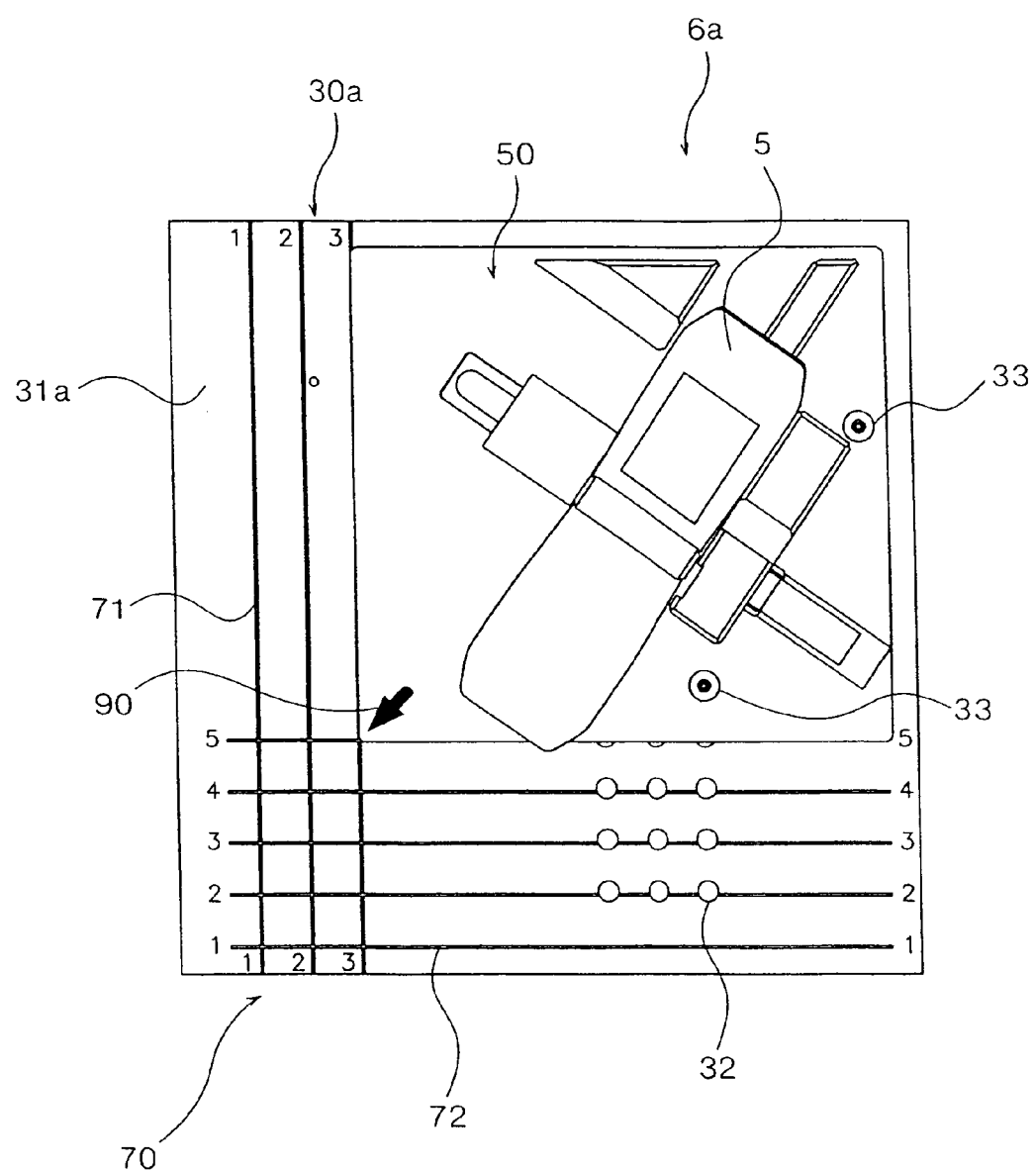

[Fig. 10]
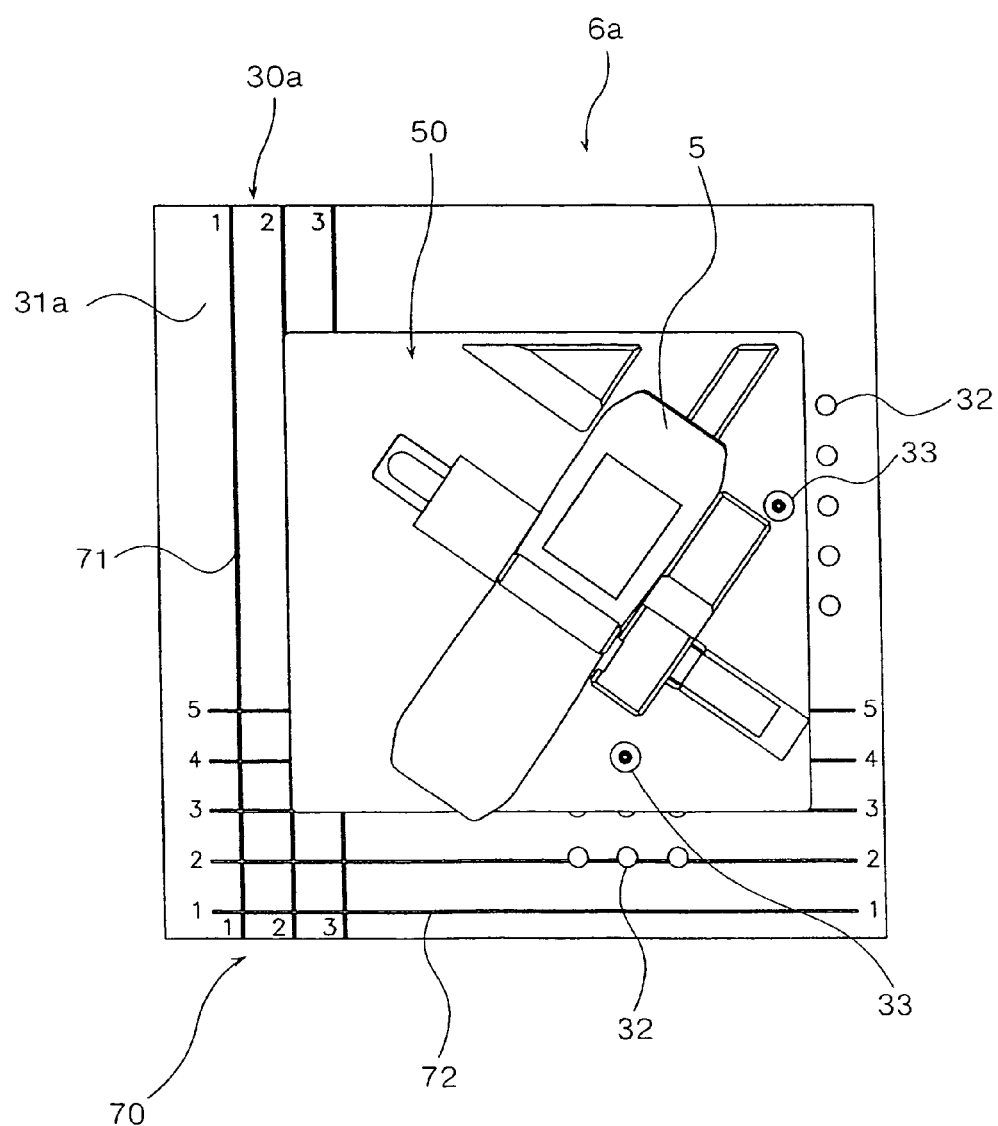

[Fig. 11]
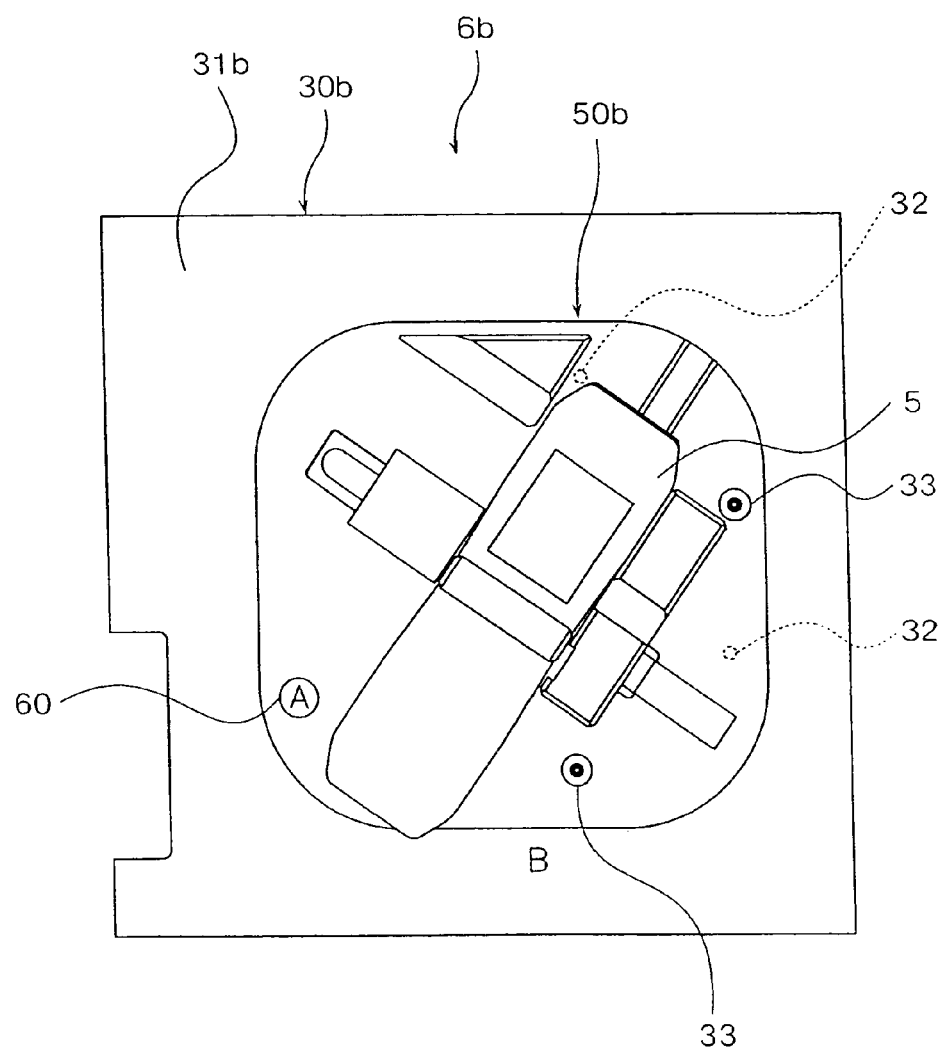

[Fig. 12]
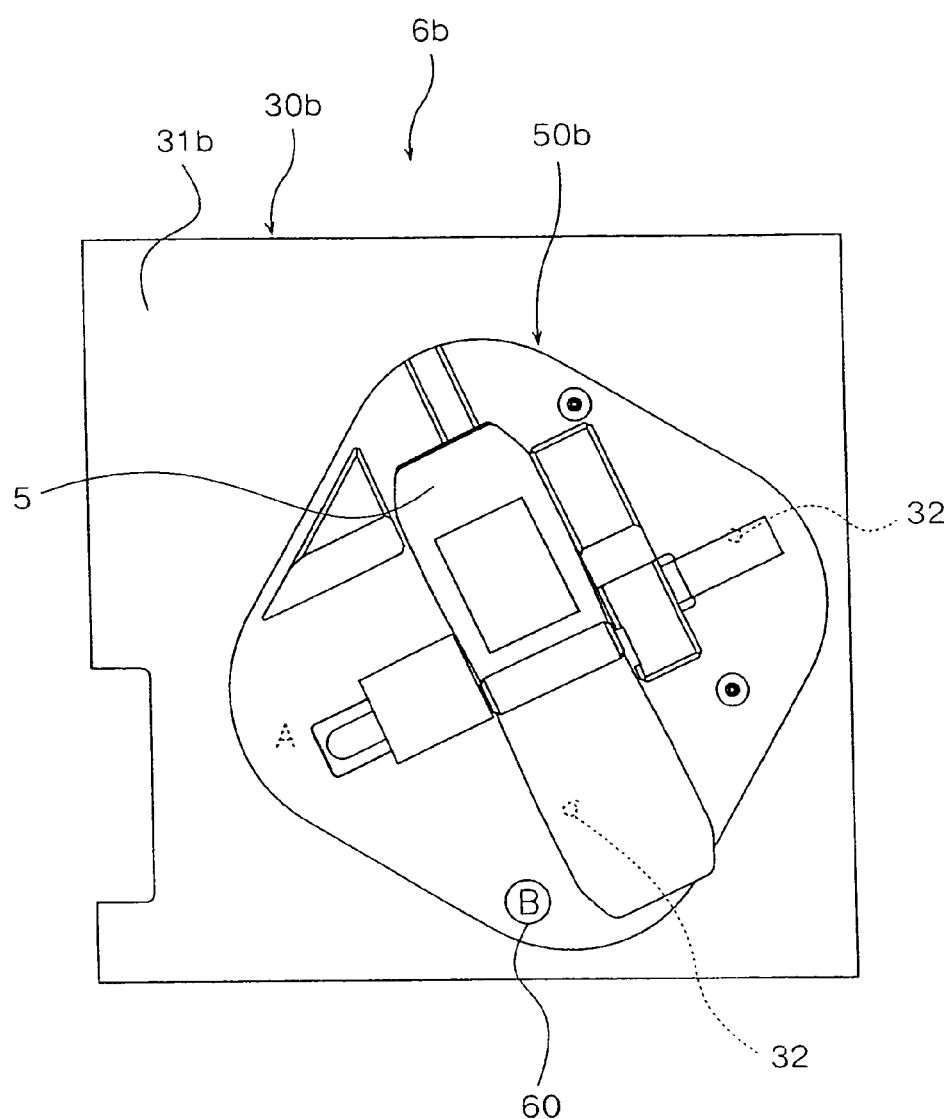

[Fig. 13]
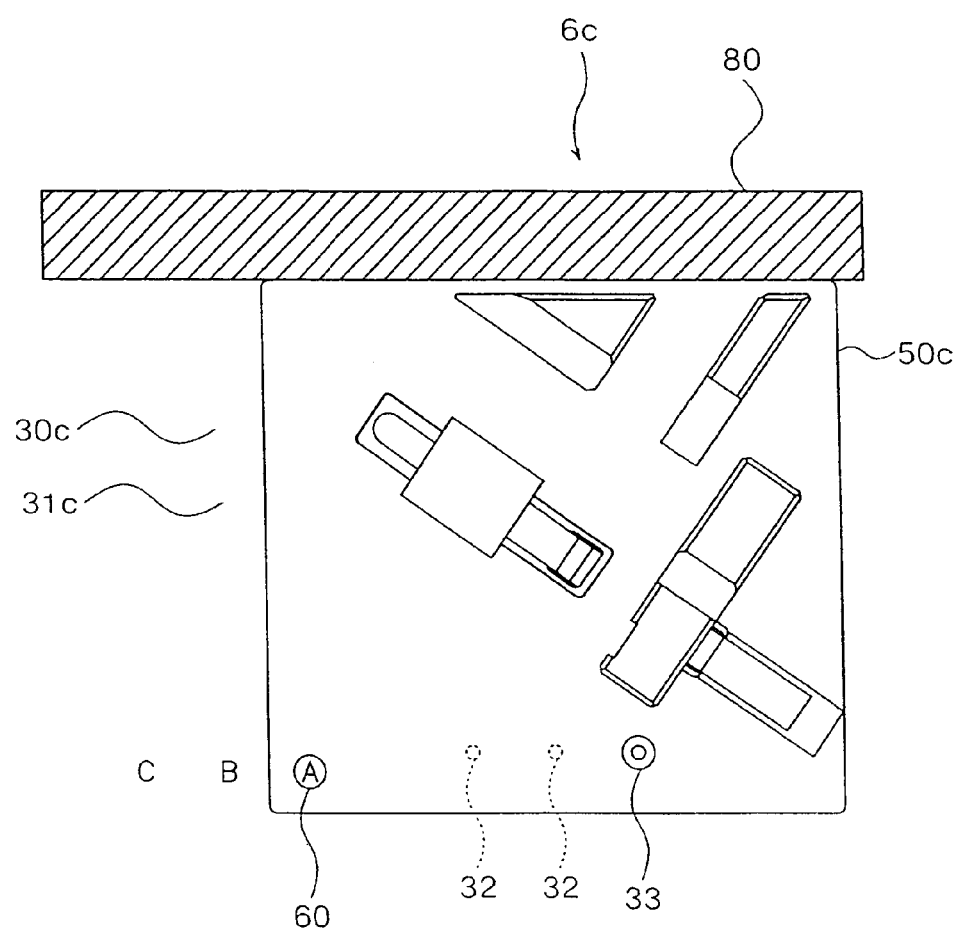

[Fig. 14]
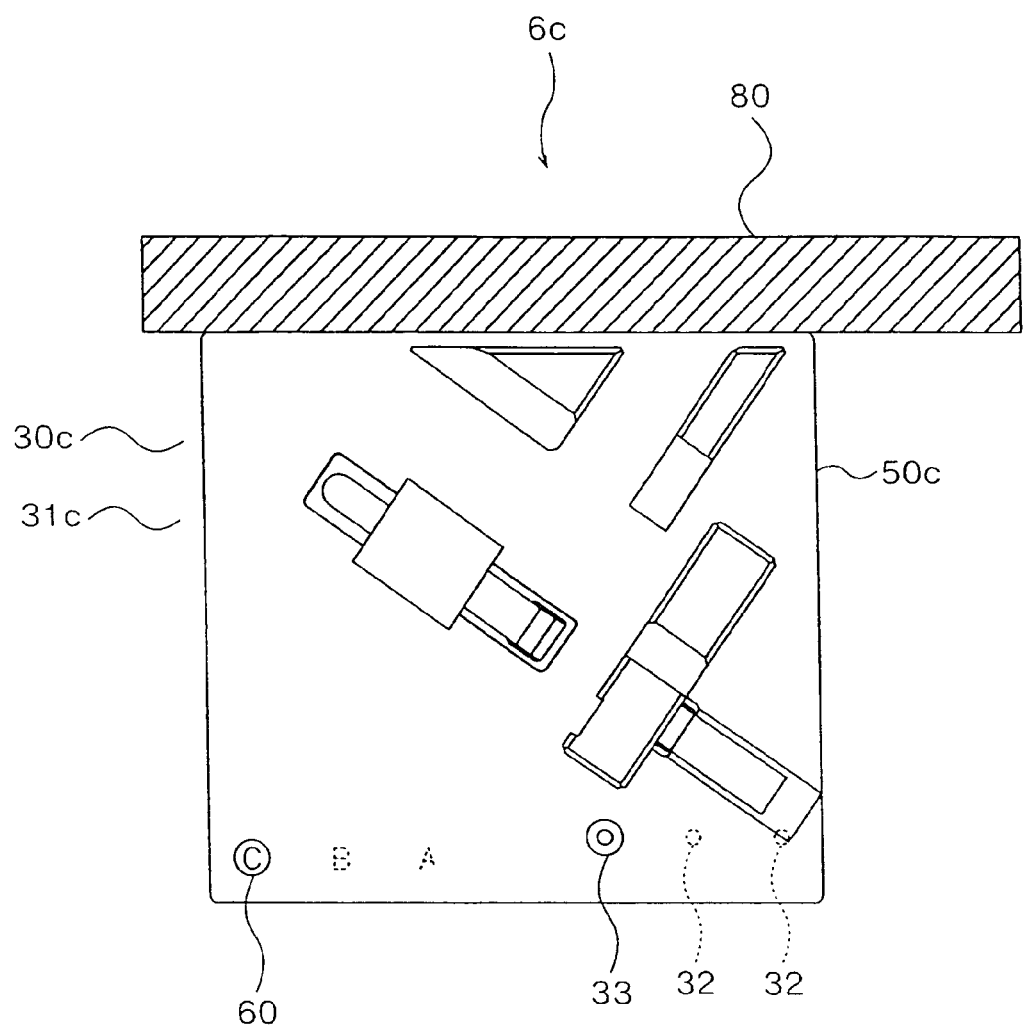

[Fig. 15]
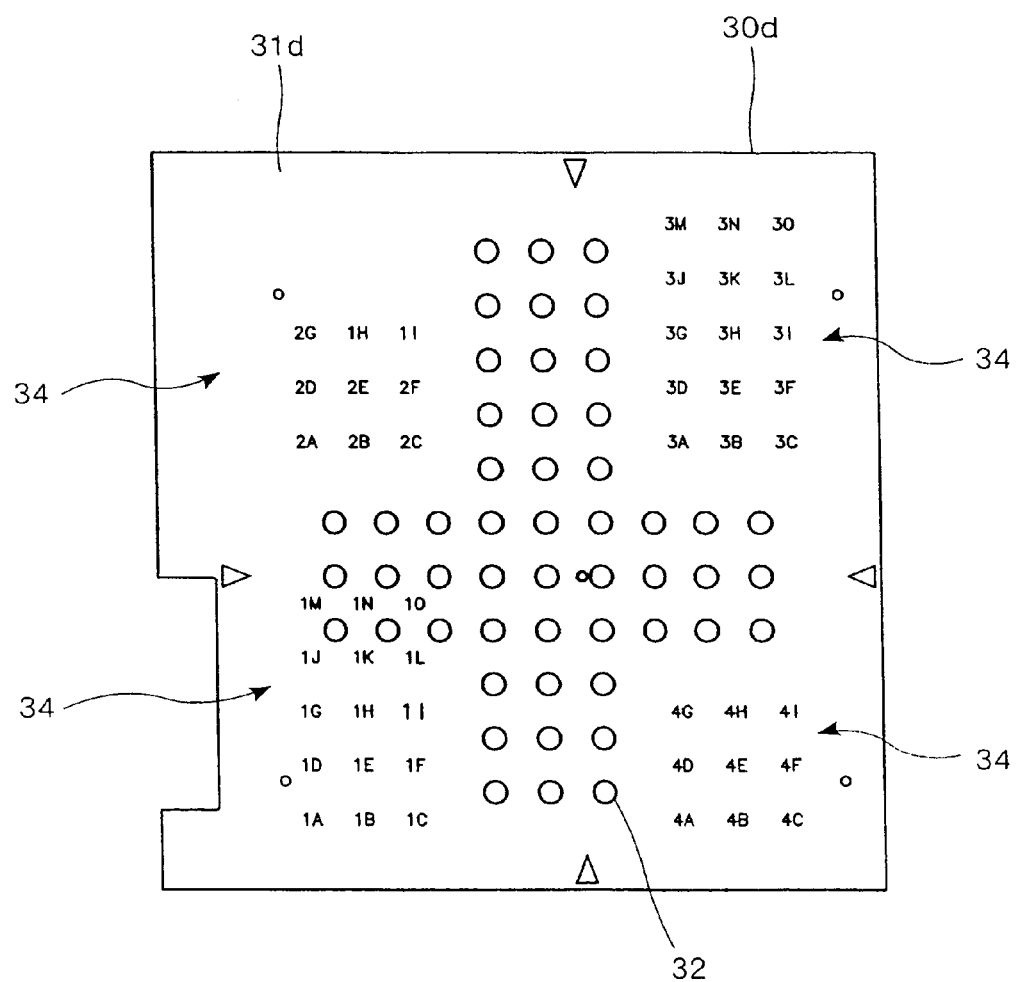

[Fig. 16]
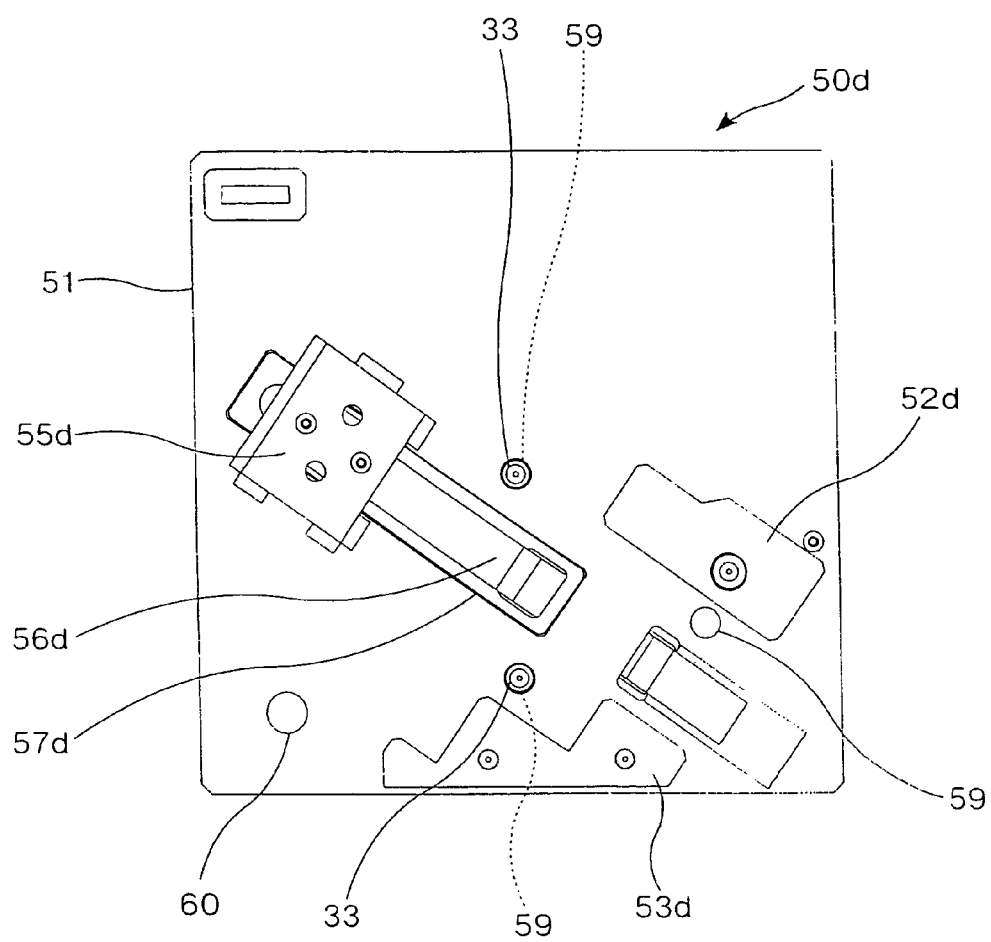

[Fig. 17]
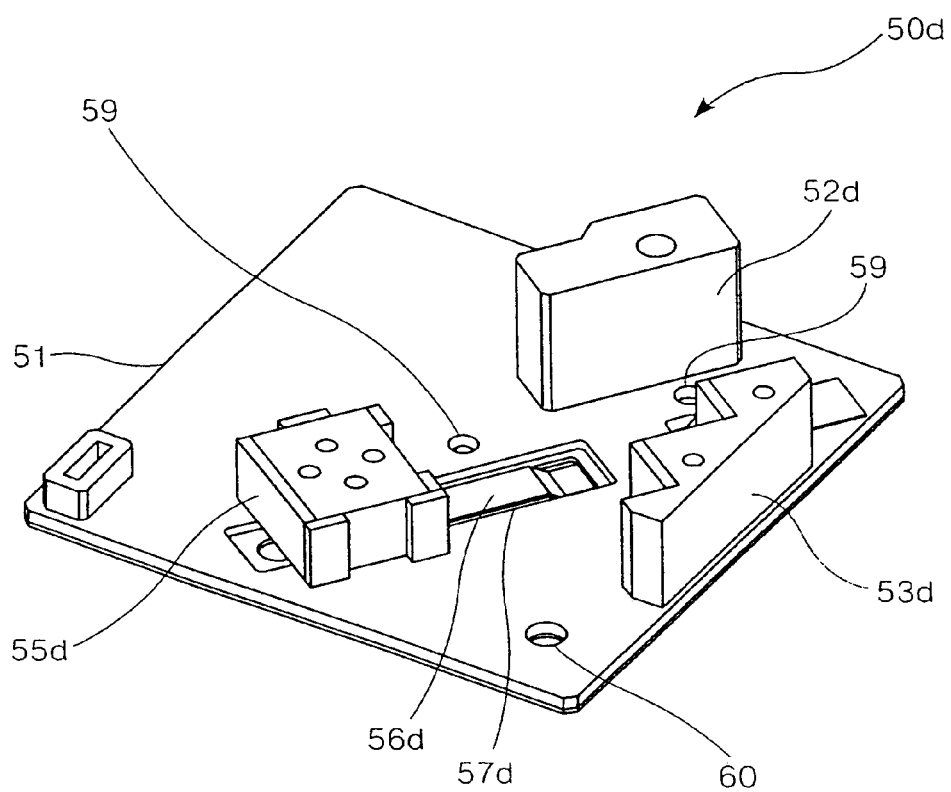

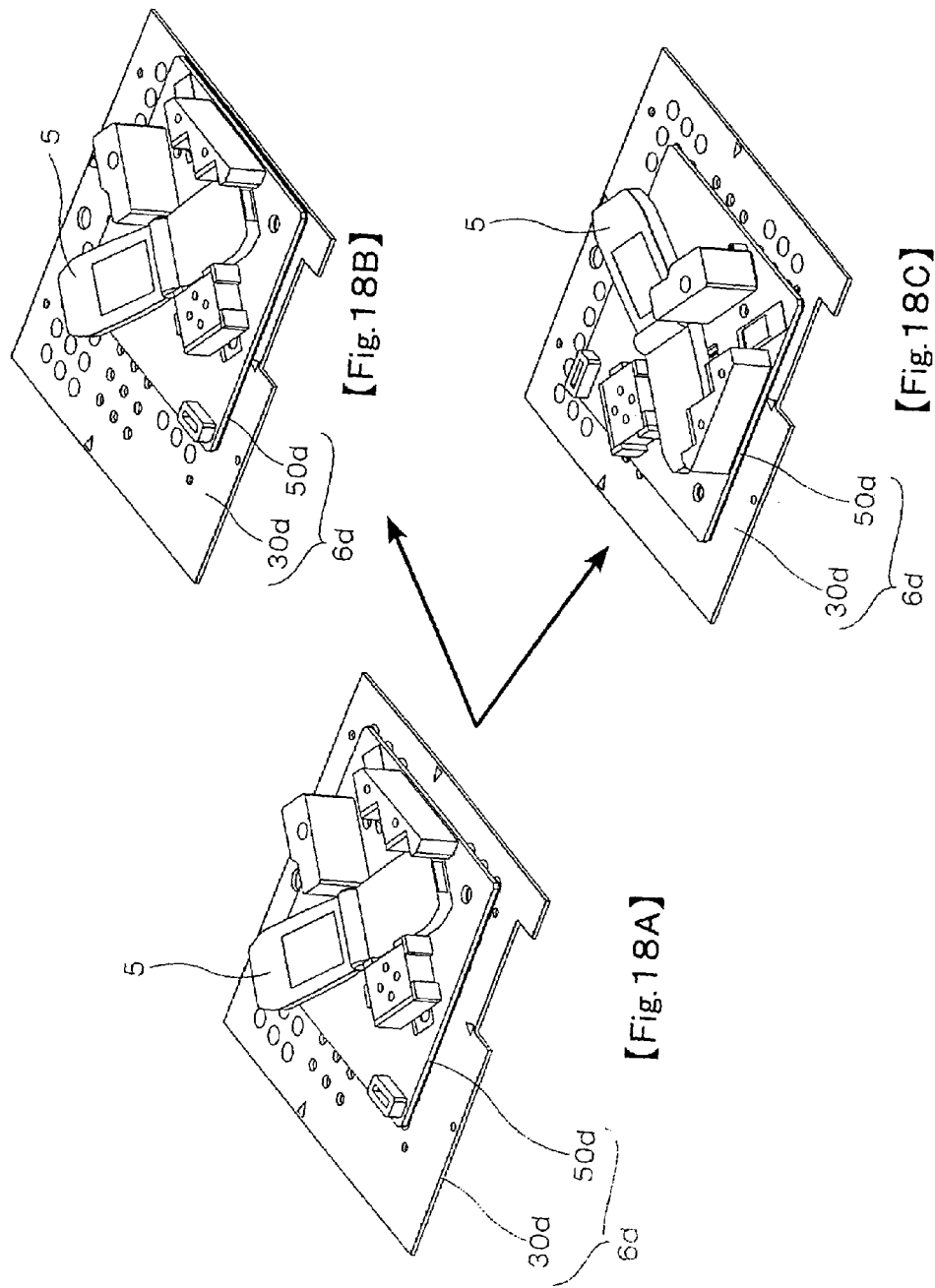

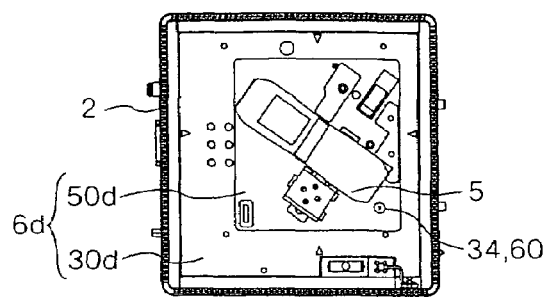
【Fig.19A】
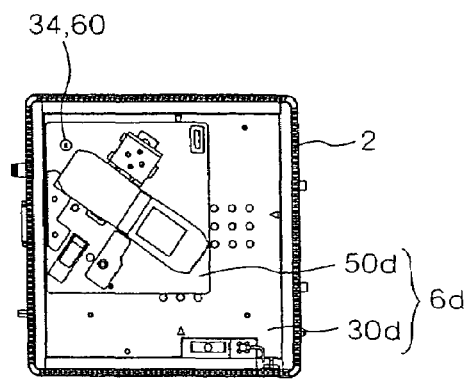
【Fig.19D】
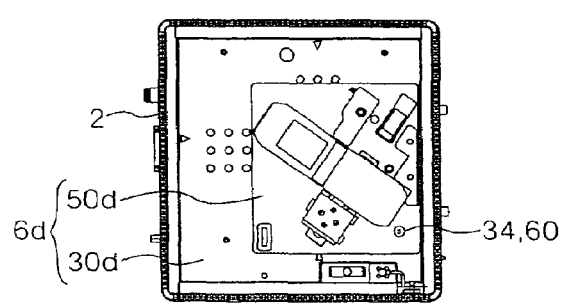
【Fig.19B】
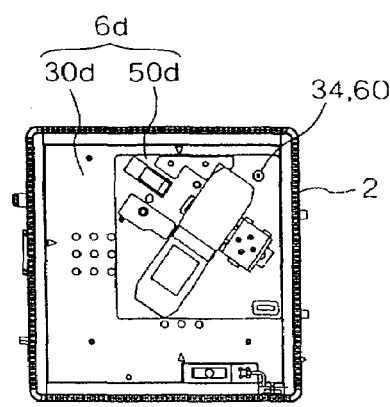
【Fig.19E】
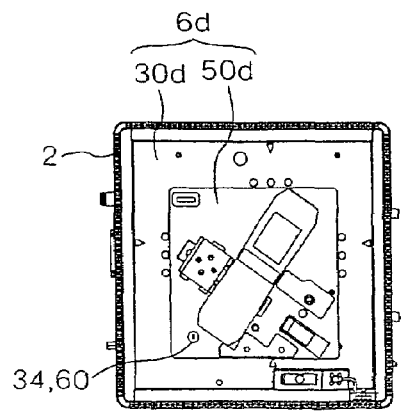
【Fig.19C】

ELECTROMAGNETIC WAVE SHIELD BOX

BACKGROUND OF THE INVENTION

1. Field of the Invention

The present invention relates to an electromagnetic wave shield box that receives a wireless terminal, such as a mobile phone, in order to perform an operation test of the wireless terminal, and, more particularly, to an electromagnetic wave shield box that is capable of providing receiving and loading positions to accomplish optimum positional relations between a coupling antenna disposed in the box and antennas of various types of wireless terminals whose antennas, including an inner-type antenna, are located at different positions, and of securing the reproducibility thereof.

2. Description of the Related Art

When a wireless terminal, such as a mobile phone, is bought or even after the wireless terminal is bought, it may be necessary to confirm whether or not the signal transmission state and the signal reception state of the wireless terminal are normal during use of the wireless terminal. For this reason, every mobile phone store usually has a tester to easily test the operation of the wireless terminal.

When the operation of the wireless terminal is tested using such a tester, an electromagnetic wave shield box, which allows the wireless terminal to be disposed in a space shielded from electromagnetic waves outside the electromagnetic wave shield box, is used to prevent the external electromagnetic waves from being introduced into an antenna of the wireless terminal to be tested such that the test results are not affected by the external electromagnetic waves.

Japanese Unexamined Patent Publication No. 2004-80271 discloses an example of electromagnetic wave shield box, which has been previously proposed by the applicant of the present application. According to the disclosure of the above-mentioned patent publication, the same type of wireless terminal is disposed at a predetermined position in the electromagnetic wave shield box, and a loading table (holder) for positioning the wireless terminal at a predetermined position in the electromagnetic wave shield box to obtain the reproducibility in the position during the test. This loading table includes a groove-shaped loading unit mounted at a predetermined position of a board fixed in the electromagnetic wave shield box such that the loading unit corresponds to the outer appearance of a folder type wireless terminal, and contact means mounted at a predetermined position adjacent to the loading unit, the contact unit being formed in the shape of a predetermined block, whereby the wireless terminal is securely disposed at a specific position in a predetermined posture in the electromagnetic wave shield box while the wireless terminal is opened in a predetermined manner, and therefore, the positional relation between the wireless terminal and a coupling antenna mounted at a predetermined position in the electromagnetic wave shield box is fixed. Furthermore, a cover, which is constructed to be openable and closable, is connected to a box body of the electromagnetic wave shield box for shielding the wireless terminal from external electromagnetic waves.

In order to perform the operation test of a wireless terminal using the above-mentioned electromagnetic wave shield box, the cover is opened, the wireless terminal, which is an object to be tested, is disposed at a predetermined position in the electromagnetic wave shield box, and the cover is closed. As a result, the wireless terminal is received in the electromagnetic wave shield box while the wireless terminal is shielded from electromagnetic waves outside the electromagnetic wave shield box, and the positional relation between the wireless terminal and the coupling antenna in the electromagnetic wave shield box is fixed. During the operation test of the wireless terminal, a radio frequency (RF) signal is transmitted from a tester located outside the electromagnetic wave shield box to the electromagnetic wave shield box such that electric waves are emitted from the coupling antenna, and the signal reception state of the wireless terminal is confirmed by the tester outside the electromagnetic wave shield box via a control line connected to the wireless terminal.

According to the above-described electromagnetic wave shield box, in the case that the wireless terminal is tested while the wireless terminal is received in the electromagnetic wave shield box, it is possible to set the position of the antenna of the wireless terminal with respect to the coupling antenna mounted in the electromagnetic wave shield box such that the same positional relation is always maintained at the position where the operational performance of the wireless terminal is the best so long as the same type of wireless terminal is tested, and therefore, it is possible to accurately perform the operation test of the wireless terminal.

As described above, according to the above-described conventional electromagnetic wave shield box, in the case of the same type of wireless terminal, the antenna of which is mounted at a predetermined position, the wireless terminal can be attached to a specific attachment position with respect to the electromagnetic wave shield box, and therefore, the positional relation between the wireless terminal and the coupling antenna mounted in the electromagnetic wave shield box is fixed. In the case of various different types of wireless terminals, whose antennas are located at different positions, however, the optimum positional relation, in which the operational performance of the wireless terminal is the best, is different for each wireless terminal. As a result, it is not possible to accurately perform the operation test of the wireless terminal using the above-described conventional electromagnetic wave shield box.

For example, a large number of mobile phones have an inner-type antenna, which is mounted in a body case of each mobile phone in addition to an telescopic-type antenna, which can be manipulated outside each mobile phone. In recent years, some types of mobile phones have been provided with only the inner-type antenna. The position of the inner-type antenna in the body case is different according to types of mobile phones, and it is difficult to confirm the position of the inner-type antenna only by viewing the outer appearance of the mobile phone. Consequently, even though the structure for positioning the body case of the mobile phone at a predetermined position in the electromagnetic wave shield box like the above-described electromagnetic wave shield box is adopted, the positional relation between the inner-type antenna of the mobile phone and the coupling antenna at the electromagnetic wave shield box is not always optimum if the type of mobile phone is different, and therefore, the test condition is changed depending upon the type of mobile phone.

For this reason, it may be possible to provide exclusive holders for positioning the respective different types of mobile phones, whose antennas are located at different positions, in the electromagnetic wave shield box, and to obviously set the positions where all types of mobile phones are disposed in the electromagnetic wave shield box. According to this method, the positional relation between the inner-type antenna and the coupling antenna of the electromagnetic wave shield box is fixed irrespective of the types of mobile phones, and it is possible to obtain optimum test conditions for any type of mobile phone. However, there are many different types of mobile phones, and it is very troublesome to prepare exclusive holders for the respective types of mobile phones and to install the exclusive holders in the respective mobile phone stores. Furthermore, a great deal of costs are necessary.

SUMMARY OF THE INVENTION

Therefore, the present invention has been made in view of the above problems, and it is an object of the present invention to provide an electromagnetic wave shield box having a positioning holder, which is capable of accomplishing the reproducibility in position of the same kind of wireless terminal in the electromagnetic wave shield box, which can be commonly applied to different types of wireless terminals, whose inner antennas are located at different positions, and which can be positioned in the electromagnetic wave shield box such that the positional relation between the inner antenna of the wireless terminal and a coupling antenna mounted in the electromagnetic wave shield box can always be set to the optimum state irrespective of whether the types of wireless terminals are the same or different.

In accordance with one aspect of the present invention, the above and other objects can be accomplished by the provision of an electromagnetic wave shield box for shielding a wireless terminal received therein from external electromagnetic waves, the electromagnetic wave shield box including: a box body for allowing the wireless terminal to be received therein, the box body having a coupling antenna mounted therein, the coupling antenna being spatially coupled with an antenna of the wireless terminal; a cover constructed to be openable and closable with respect to the box body; a reference table mounted at a predetermined position above the coupling antenna in the box body, the reference table having a reference surface, which is referenced when the wireless terminal is disposed thereon; loading unit for allowing the wireless terminal to be loaded thereon, the loading unit being movable along the reference surface; and fixing means for detachably fixing the loading unit, on which the wireless terminal is loaded, to a predetermined position of the reference surface of the reference table to define the positional relation between the antenna of the wireless terminal and the coupling antenna.

Preferably, the electromagnetic wave shield box further includes: position indication means for indicating the position of the loading unit disposed on the reference surface, the position indication means being constituted by an indication part provided at the reference table and a specifying part provided at the loading unit for indicating a specific position of the indication part.

In a preferred embodiment, the indication part is a plurality of symbols provided on the reference surface, and the specifying part is a hole formed in the loading unit for allowing at least one of the symbols to be revealed therethrough.

In another preferred embodiment, the indication part is a coordinate axis having a plurality of straight lines provided on the reference surface, while the straight lines are arranged at predetermined intervals along directions in which the loading unit is moved on the reference surface such that the loading unit is positioned, and symbols for indicating the respective straight lines, and the specifying part is at least a part of the outer appearance of the loading unit, which is disposed along the straight lines in the case that the loading unit is disposed at the reference surface.

Preferably, the fixing means includes locking holes formed at the reference surface of the reference table, through-holes formed at the loading unit, and fixing pins removably inserted into the locking holes through the through-holes for fixing the loading unit to the reference surface.

Preferably, the loading unit is movable in a first movement pattern, in which the loading unit can be moved in a first linear direction extending along the reference surface and in a second linear direction perpendicular to the first linear direction, the second linear direction also extending along the reference surface, and/or in a second movement pattern, in which the loading unit can be moved in a rotating direction of the loading unit along the reference surface.

In accordance with another aspect of the present invention, there is provided an electromagnetic wave shield box for shielding a wireless terminal received therein from external electromagnetic waves, the electromagnetic wave shield box including: receiving means for receiving the wireless terminal to be tested therein, the receiving means having a coupling antenna mounted therein, the coupling antenna being electromagnetically coupled with an antenna of the wireless terminal; a reference surface disposed at a predetermined position, where the reference surface is spaced apart from the coupling antenna, in the receiving means such that the reference surface extends in the direction perpendicular to a main emission direction of the coupling antenna; and a loading unit for allowing the wireless terminal to be loaded thereon, the loading unit being movable along the reference surface such that the loading unit can be moved in the direction perpendicular to the main emission direction of the coupling antenna, wherein the loading unit is positioned with respect to the reference surface such that the antenna of the wireless terminal and the coupling antenna can be electromagnetically coupled with each other under the optimum condition.

BRIEF DESCRIPTION OF THE DRAWINGS

The above and other objects, features and other advantages of the present invention will be more clearly understood from the following detailed description taken in conjunction with the accompanying drawings, in which:

FIG. 1 is a perspective view illustrating an electromagnetic wave shield box according to a first preferred embodiment of the present invention;

FIG. 2 is a plan view illustrating the pattern of a coupling antenna;

FIG. 3 is a plan view illustrating the pattern of another coupling antenna;

FIG. 4 is a plan view illustrating a reference table in the electromagnetic wave shield box according to the first preferred embodiment of the present invention;

FIG. 5 is a plan view illustrating a loading unit in the electromagnetic wave shield box according to the first preferred embodiment of the present invention;

FIG. 6 is a perspective view illustrating a holder in the electromagnetic wave shield box according to the first preferred embodiment of the present invention (H position);

FIG. 7 is a perspective view illustrating the holder, where a wireless terminal is positioned, in the electromagnetic wave shield box according to the first preferred embodiment of the present invention (C position);

FIG. 8 is a perspective view illustrating the holder, where a wireless terminal is positioned, in the electromagnetic wave' shield box according to the first preferred embodiment of the present invention (H position);

FIG. 9 is a plan view illustrating a holder, where a wireless terminal is positioned, in an electromagnetic wave shield box according to a second preferred embodiment of the present invention (3-5 position);

FIG. 10 is a plan view illustrating the holder, where a wireless terminal is positioned, in the electromagnetic wave shield box according to the second preferred embodiment of the present invention (2-3 position);

FIG. 11 is a plan view illustrating a holder, where a wireless terminal is positioned, in an electromagnetic wave shield box according to a third preferred embodiment of the present invention (A position);

FIG. 12 is a plan view illustrating the holder, where a wireless terminal is positioned, in the electromagnetic wave shield box according to the third preferred embodiment of the present invention (B position);

FIG. 13 is a plan view illustrating a holder, where a wireless terminal is positioned, in an electromagnetic wave shield box according to a fourth preferred embodiment of the present invention (A position);

FIG. 14 is a plan view illustrating the holder, where a wireless terminal is positioned, in the electromagnetic wave shield box according to the fourth preferred embodiment of the present invention (C position);

FIG. 15 is a plan view illustrating a reference table in an electromagnetic wave shield box according to a fifth preferred embodiment of the present invention;

FIG. 16 is a plan view illustrating a loading unit in the electromagnetic wave shield box according to the fifth preferred embodiment of the present invention;

FIG. 17 is a perspective view illustrating the loading unit in the electromagnetic wave shield box according to the fifth preferred embodiment of the present invention;

FIGS. 18A to 18C are perspective views respectively illustrating a holder, where a wireless terminal is positioned at three different positions (1E, 1A, and 2G), in the electromagnetic wave shield box according to the fifth preferred embodiment of the present invention; and FIGS. 19A to 19E are plan views respectively illustrating the holder, where a wireless terminal is positioned at five different positions (1E, 1A, 2G, 3O, and 4C), in the electromagnetic wave shield box according to the fifth preferred embodiment of the present invention.

DESCRIPTION OF THE PREFERRED EMBODIMENTS

Now, preferred embodiments of the present invention will be described in detail with reference to the accompanying drawings.

1. First Preferred Embodiment (FIGS. 1 to 8)

FIG. 1 is a perspective view illustrating an electromagnetic wave shield box 1 according to a first preferred embodiment of the present invention.

The electromagnetic wave shield box 1 is a box that shields a wireless terminal, such as a mobile phone, from electromagnetic waves outside the electromagnetic wave shield box in order to perform an operation test of the wireless terminal. The electromagnetic wave shield box 1 includes a box body 2 and a cover 3.

As shown in FIG. 1, the box body 2 has an outer basket, which is made of a metal sheet, such as an aluminum sheet, that can reflect electromagnetic waves. In the outer basket of the box body 2 is fixed a board 4, on which a coupling antenna (not shown) is formed, at a predetermined position at the bottom side of the box body 2. Above the board 4 is mounted a holder 6 for positioning a wireless terminal 5. The holder 6 is arranged in parallel with the board 4 having the coupling antenna 7 formed thereon while the holder 6 is spaced a predetermined distance from the board 4.

The coupling antenna 7 of the board 4 is constructed such that the coupling antenna 7 can emit predetermined electromagnetic waves in the electromagnetic wave shield box 1 and receive a radio frequency (RF) signal from a tester (not shown) located outside the box body 2. Also, the wireless terminal 5 loaded on the holder 6, which is disposed above the coupling antenna 7, is connected to a control circuit via a cable 8 in the box body 2, as shown in FIG. 1. The control circuit is connected to the tester located outside the box body 2 via a cable (not shown). The wireless terminal 5 can be operated by the tester outside the electromagnetic wave shield box 1.

The upper surface of the box body 2 is opened in the shape of a rectangle. At the edge of the opening part is formed a groove 9, which extends along the circumference of the opening part. In the groove 9 is mounted a shield spring having conductivity, which is formed approximately in the sectional shape of V. The V-shaped lower end of the shield spring is separated from the groove, although the V-shaped lower end of the shield spring is normally in contact with the groove while being elastically compressed.

The cover 3 is formed of a metal sheet, such as an aluminum sheet, that can reflect electromagnetic waves. The cover 3 is connected to the box body 2 such that the cover 3 can be hingedly rotated with respect to the box body 2, by means of a supporting shaft 10, for opening and closing the opening part of the box body 2. At the cover 3 is mounted an endless protrusion 11, which corresponds to the groove 9 mounted at the edge of the opening part of the box body 2 such that the protrusion 11 can be engaged in the groove 9. When the cover 3 is closed, the protrusion 11 is engaged in the groove 9, and as a result, the tip edge of the protrusion 11 serves to contact the shield spring. When the cover 3 is closed, the protrusion is locked in the box body 2 side by means of locking means (not shown), by which the closed state of the cover 3 is securely maintained.

The box body 2 and the cover 3 together constitute receiving means for receiving the wireless terminal 5 to be tested therein.

The coupling antenna 7, which is mounted at the board 4 disposed below the holder 6 in the box body 2, is an antenna spatially coupled to the antenna of the wireless terminal 5 loaded at the holder 6, which is disposed above the coupling antenna 7. In this embodiment, the coupling antenna 7 is constructed using a self-complementary antenna or another antenna corresponding to the self-complementary antenna.

In the above description, the spatial coupling between the two antennas means that the two antennas are electromagnetically coupled with each other via free space, which is used as a medium. Any media may be disposed between the two antennas so long as the electromagnetic coupling is not interfered with by the media. In this embodiment, the two antennas are electromagnetically coupled with each other over the holder 6, which is made of a nonmetal material (for example, plastic).

FIG. 2 is a plan view illustrating the pattern of a coupling antenna 7 in the electromagnetic wave shield box according to the first preferred embodiment of the present invention, and FIG. 3 is a plan view illustrating the pattern of another coupling antenna 7' in the electromagnetic wave shield box according to the first preferred embodiment of the present invention.

As shown in FIG. 2, the coupling antenna 7 includes a pair of antenna elements 15 and 16 formed on the upper surface of the board 4 in a predetermined pattern. One of the antenna elements 15 has a plurality of fan-shaped metal sheets 17 having small width. The fan-shaped metal sheets 17 are radially arranged side by side at intervals having the same shape as the fan shape of each fan-shaped metal sheet 17. The tip ends of the fan-shaped metal sheets 17 are connected to one another at a power supply unit 18 disposed at the emission center side. Also, the other antenna element 16 has a plurality of fan-shaped metal sheets 17 having small width, like the antenna element 15. The fan-shaped metal sheets 17 are radially arranged side by side at intervals having the same shape as the fan shape of each fan-shaped metal sheet 17. The tip ends of the fan-shaped metal sheets 17 are connected to one another at a power supply unit 19 disposed at the emission center side. The antenna elements 15 and 16 are disposed in a symmetrical fashion.

The self-complementary antenna is an antenna characterized in that the antenna elements are formed in a plane structure having the shape of a metal sheet, and especially, when the antenna elements are rotated a predetermined angle about the common point or when the antenna elements are folded along a predetermined line, the metal parts and the spatial parts (nonmetal parts) are counterchanged. In the case that the size of the antenna elements of the self-complementary antenna is limitless, the impedance of the antenna is constant (60 $\pi\Omega$) irrespective of the frequency. In the case that the size of the antenna elements of the self-complementary antenna is limited, on the other hand, the lowest use frequency is decided depending upon the size of the antenna elements of the self-complementary antenna.

As shown in FIG. 2, the range of angle at which the fan-shaped metal sheets 17 of the antenna elements 15 and 16 of the coupling antenna 7 are disposed is 180 degrees for each antenna element. When the metal part, including the antenna elements 15 and 16, conforms to the remaining part excluding the metal part as the metal part is rotated a predetermined angle in a circle having a radius approximately corresponding to the length of each fan-shaped metal sheet 17, the antenna can be referred to as a self-complementary antenna. Consequently, the antenna has a constant impedance close to 60 $\pi\Omega$ within the wide range of frequency greater than the frequency decided by the size (the radius) of the antenna elements 15 and 16.

Also, the coupling antenna 7' shown in FIG. 3 is a self-complementary antenna including two algorithmic spiral-type antenna elements 20 and 21. Specifically, the coupling antenna 7' is a circular polarization-type self-complementary antenna.

As described above and also shown in FIG. 1, the holder 6 is disposed above the coupling antenna 7 in the box body 2 of the electromagnetic wave shield box 1 for positioning the wireless terminal 5 with respect to the coupling antenna 7.

The holder 6 includes a flat plate-shaped reference table 30, which is mounted at a predetermined position above the coupling antenna 7 in the box body 2, a wireless terminal loading unit 50 movable along a reference surface 31 of the reference table 30, and fixing means (for example, a fixing pin, which will be described hereinafter) for detachably fixing the loading unit 50 to the reference surface 31 of the reference table 30. The reference table 30, the loading unit 50, and the fixing means are made of nonmetal material.

As shown in the plan view of FIG. 4, the reference table 30 is a plate-shaped member having the outer appearance of an approximately rectangular shape, which corresponds to the opening part of the box body 2. As shown in FIG. 1, the reference table 30 is fixed to the box body 2, such that the reference table 30 is disposed in parallel with the board 4, on which the coupling antenna 7 is formed, while the reference table 30 is spaced a predetermined distance from the board 4, in the box body 2, whereby the positional relation between the reference table 30 and the coupling antenna 7 is fixed. The reference surface 31 is the flat upper surface of the reference table 30, at which a wireless terminal loading position can be arbitrarily selected.

In this embodiment, the main emission direction of the coupling antenna 7 is perpendicular to the upper surface of the board 4. Since the reference surface 31 is parallel with the board 4 as described above, the movable range of the loading unit 50 is limited to the plane perpendicular to the main emission direction of the coupling antenna 7. In other words, the reference surface 31 allows the loading unit 50 to be moved in the direction perpendicular to the main emission direction of the coupling antenna 7.

As shown in FIG. 4, two locking hole sets 32 are formed at a part of the reference surface 31. Each locking hole set 32 has a total of 15 locking holes, which are arranged in a matrix of 5×3. Fixing pins, as the fixing means for fixing the loading unit 50 to the reference surface 31, are locked in the locking holes of the respective locking hole sets 32.

As shown in FIG. 4, alphabetic letters 34, which are symbols indicating the position where the loading unit 50 is fixed, are formed on a part of the reference surface 31. The alphabetic letters 34 are disposed at a total of 15 positions of the reference surface 31, which are arranged in a matrix of 5×3. The alphabetic letters 34 include A to O, which are 15 letters. When the loading unit 50 is fixed to the reference surface 31, one of the alphabetic letters 34 is visible to show the positional relation between the reference surface 31 and the loading unit 50 having a specific structure, which will be described hereinafter. Consequently, it is possible to show the position where the loading unit 50 is disposed on the reference surface 31 using the alphabetic letters. Alternatively, it is possible to show symbols, such as types of wireless terminals, indicated on the wireless terminals instead of the alphabetic letters such that the position where the loading unit is disposed can be directly recognized without referring to a table corresponding to the position where the loading unit is disposed.

As shown in the plan view of FIG. 5 and the perspective view of FIG. 6, the loading unit 50 has a plate part 51, which is formed in the shape of a rounded rectangle smaller than that of the reference table 30, and a holding means for holding the wireless terminal 5 on the plate part 51. The holding means includes a first positioning block 52 having a step part, which holds one end of the wireless terminal 5, a second positioning block 53, which is formed in the shape of a step and holds one side surface of the wireless terminal 5, a third positioning block 54, which is formed in the shape of a trigonal prism and holds the other side surface of the wireless terminal 5 adjacent to the one end of the wireless terminal 5, and a movable fixing block 55, which is formed in the shape of a rectangular parallelepiped and holds the other side surface of the wireless terminal 5. To the fixing block 55 is connected one end of a rubber band 56, which serves as an elastic member. The rubber band 56 is disposed in a groove 57 formed at the plate part 51 such that the groove 57 extends along the direction perpendicular to the longitudinal direction of the wireless terminal 5. Also, the rubber band 56 is inserted through a stopper structure 58, which is mounted in the groove 57, and the other end of the rubber band 56 is withdrawn to the outside of the second positioning block 53. Consequently, the position of the fixing block 55 can be adjusted depending upon the size of the wireless terminal. Also, these blocks 52 to 55 may be made of polyethylene-based foam material or urethane-based foam material.

As shown in FIG. 5, through-holes 59 are formed at two predetermined positions of the plate part 51, and fixing pins 33 are inserted in the through-holes 59, respectively. The tip ends of the fixing pins 33 protrude under the plate part 51. The through-holes 59 and the fixing pins 33, together with the plurality of locking holes 32 formed at the reference table 30, constitute fixing means for detachably fixing the loading unit 50, at which the wireless terminal 5 is loaded, to a predetermined position of the reference surface 31 of the reference table 30.

As shown in FIG. 5, a hole 60, which serves as a specifying part for specifying one of numeric-combined alphabetic letters 34, is formed in one corner of the plate part 51, which corresponds to the alphabetic letters provided on the reference surface 31. The hole 60, together with the alphabetic letters 34 provided on the reference surface 31, constitutes position indication means for indicating the position of the loading unit 50 disposed on the reference surface 31. Specifically, when the loading unit 50 is disposed at a specific position on the reference surface 31, a specific one of the alphabetic letters 34 provided on the reference surface 31 is revealed through the hole 60. In this way, the position of the loading unit 50 can be indicated using the alphabetic letters. Alternatively, it is possible to find the position of the loading unit 50 at which a specific one of the alphabetic letters is revealed through the hole 60 and then to fix the loading unit 50 to the reference table 30 by means of the fixing pins 33.

In the case that an operation test of the wireless terminal 5 is performed using the electromagnetic wave shield box 1 with the above-described construction according to this embodiment, the cover 3 shown in FIG. 1 is opened, and then the wireless terminal 5 to be tested is connected to the control circuit at the box body 2 side via the cable 8. Subsequently, the loading unit 50, at which the wireless terminal 5 is loaded, is disposed on a predetermined position on the reference table 30 mounted in the box body 2, and then the cover 3 is closed. In this way, the wireless terminal 5 inside the electromagnetic wave shield box 1 is shielded from electromagnetic waves outside the electromagnetic wave shield box 1. After that, a control signal from a tester (not shown) is inputted to the wireless terminal 5 via the cable. As a result, the wireless terminal 5 is controlled, and the operation test, such as signal transmission, signal reception, or sensitivity, is performed on the wireless terminal 5, which is spatially coupled to the coupling antenna 7.

In order to load and fix the wireless terminal 5 on the loading unit 50, the wireless terminal 5 is loaded in the first to third positioning blocks 52 to 54 in a predetermined posture such that the wireless terminal 5 is held by the first to third positioning blocks 52 to 54 at the predetermined surfaces thereof, and then the other end of the rubber band 56 is pulled toward the outside of the second positioning block 53 such that the fixing block 55 can contact the other side surface of the wireless terminal 5 by the elastic force of the rubber band 56. As a result, the wireless terminal 5 is fixed on the loading unit 50 in the predetermined posture.

The posture of the wireless terminal 5 fixed on the loading unit 50 is set depending upon types of wireless terminals. As will be described hereinafter, the positional relations between the antenna of the wireless terminal 5 and the coupling antenna 7 can be optimally set by putting the loading unit 50 at the predetermined position on the reference table 30. Consequently, when the posture of the wireless terminal loaded on the loading unit 50 and the position where the loading unit 50 is disposed on the reference table 30 are approximately set in various types of wireless terminals 5, types of which are different and the positions of inner antennas of which are also different, it is possible to easily set the positional relations between the wireless terminal 5 and the coupling antenna 7 in the electromagnetic wave shield box 1 under optimum conditions irrespective of the types of wireless terminals 5. That is to say, according to this embodiment, it is possible to perform operation tests of various types of wireless terminals 5 using only this single holder 6.

As shown in FIG. 7, for example, a certain type of wireless terminal 5 is loaded at the loading unit 50 in a predetermined posture, and then the loading unit 50 is disposed at a specific position, which is decided according to the type of the wireless terminal, on the reference surface 31 of the reference table 30. Subsequently, the two fixing pins 33 are inserted into the two corresponding locking holes 32 of the reference table 30, respectively. At this time, the letter C of the alphabetic letters 34 is revealed through the hole 60 of the plate part 51 of the loading unit 50. That is to say, when this type of wireless terminal 5 is loaded at the loading unit 50 in the predetermined posture, and the loading unit 50 is set to the C position of the reference surface 31, the coupling condition between the wireless terminal 5 and the coupling antenna 7 is optimized. This optimum position can be found while the position of the loading unit 50 is appropriately changed and the tester is operated to perform the test of the wireless terminal 5. Once the optimum position is decided, it is possible to easily reset the optimum position while targeting the letter C of the reference surface 31, which is revealed through the hole 60 of the loading unit 50, when this type of wireless terminal is tested again, since it is determined that the optimum position is the C position.

On the other hand, another type of wireless terminal 5a, which is different from the wireless terminal 5 of FIG. 7, is shown in FIG. 8. This wireless terminal 5a has the same outer appearance as the wireless terminal 5 of the FIG. 7. However, the position of the inner antenna of the wireless terminal 5a is different from that of the inner antenna of the wireless terminal 5. For this reason, when the wireless terminal 5a is disposed at the C position of FIG. 7, it is not possible to optimize conditions of the test performed by the coupling antenna. In this embodiment, the optimum position of the wireless terminal 5a shown in FIG. 8 is the position where the letter H is revealed through the hole 60 of the loading unit 50 (H position).

2. Second Preferred Embodiment (FIGS. 9 and 10)

FIGS. 9 and 10 are plan views illustrating a holder 6a in an electromagnetic wave shield box according to a second preferred embodiment of the present invention. The second preferred embodiment is different from the first preferred embodiment in terms of the construction of the position indication means for indicating the position of the loading unit 50 disposed on the reference surface 31. (In the first preferred embodiment, one of the alphabetic letters is revealed through the hole.) Other construction of the second preferred embodiment is substantially identical to that of the first preferred embodiment. Therefore, the second preferred embodiment will be described hereinafter in connection with the construction of the part different from the first preferred embodiment, and a description of the construction of the other parts, which are identical to that of the first preferred embodiment, will not be given by quoting the description of the first preferred embodiment.

As shown in FIG. 9, pluralities of straight lines 71 and 72 are provided on a reference surface 31a of a reference table 30a. The straight lines 71 and 72 are arranged at predetermined intervals. The straight lines 71 are disposed in one direction, and the straight lines 72 are disposed in another direction, which is perpendicular to the direction at which the straight lines 71 are disposed. The straight lines 71 and 72 constitute a coordinate axis 70, which is an indication part for indicating the position of the loading unit 50. The respective straight lines 71 and 72 of the coordinate axis 70 are given consecutive numbers along the respective directions. The specific points on the coordinate axis 70 (intersection points of the straight lines 71 and 72 disposed in the two perpendicular directions) are indicated in the combination of two numbers. Specifically, as shown in FIG. 9, numbers of 1 to 5 are given from bottom to top in the horizontal direction, and numbers of 1 to 3 are given from left to right in the vertical direction.

As shown in FIG. 9, the locking holes 32 formed at the reference surface 31a to lock the two fixing pins 33 are formed at two predetermined positions in groups in a regular columnar disposition pattern with respect to the disposition of the intersection points of the coordinate axis 70, such that the loading unit 50 can be selectively disposed on the reference surface 31a, in a plurality of positions at which the respective sides of the loading unit 50 conform to the respective straight lines 71 and 72 of the coordinate axis 70, and the left lower corner of the loading unit 50 is positioned at the intersection point of the coordinate axis 70. That is to say, in this embodiment, the outer appearance of the loading unit 50 (the left side and the lower side parallel along the coordinate axis 70, and the left lower corner in FIG. 9) is a specifying part for indicating a specific intersection point of the coordinate axis 70, whereby it is possible to specify the position of the loading unit 50 disposed at the reference surface 31a. When the position of the loading unit 50 is indicated in the combination of the vertical-axis number and the horizontal-axis number, the position of the loading unit 50 of FIG. 9 is indicated by 3-5, and the position of the loading unit 50 of FIG. 10 is indicated by 2-3. Also, as shown in FIG. 9, it is possible to use an indication arrow 90 as the specifying part for indicating a specific intersection point of the coordinate axis, instead of the outer appearance of the loading unit 50 (The indication arrow 90 is shown only in FIG. 9, not in FIG. 10.).

According to this embodiment, it is possible to select a specific position among the plurality of positions by positioning the common holder 6a along the coordinate axis 70, whereby the respective positions can be obviously indicated by the indication of the coordinate axis 70. The intersection points of the coordinate axis 70 are large in number, and therefore, it is possible to easily set a plurality of positions of the loading unit in response to the necessity to position the loading unit 50.

3. Third Preferred Embodiment (FIGS. 11 and 12)

FIGS. 11 and 12 are plan views illustrating a holder 6b in an electromagnetic wave shield box according to a third preferred embodiment of the present invention. The second preferred embodiment will be described hereinafter in connection with the construction of a novel part different from the first preferred embodiment, and a description of the construction of the other parts, which are identical to that of the first preferred embodiment, will not be given by quoting the description of the first preferred embodiment.

As shown in FIGS. 11 and 12, locking holes 32, which serve as fixing means, are formed at four predetermined positions in a reference surface 31b of a reference table 30b. Two fixing pins 33, which are fitted in two through-holes of a loading unit 50b, can be engaged into the corresponding locking holes 32 at two positions shown in FIGS. 11 and 12, and therefore, it is possible to select two positions having different rotating directions on the reference surface 31b of the loading unit 50b. On the other hand, two alphabetic letters, A and B, which serve as indication means, are provided at predetermined different positions on the reference surface 31b. In the case that the loading unit 50b is disposed at the position of FIG. 11, the letter A is revealed through the hole 60 of the loading unit 50b. In the case that the loading unit 50b is disposed at the position of FIG. 12, on the other hand, the letter B is revealed through the hole 60 of the loading unit 50b.

According to this embodiment, it is possible to select two positions using the common holder 6b and then to reveal alphabetic letters indicating the respective positions through the hole 60 of the loading unit 50b at the respective positions. Furthermore, it is possible to specify many more positions by increasing the number and positions of the locking holes 32 and the kinds and positions of the alphabetic letters, which serve as the indication means.

4. Fourth Preferred Embodiment (FIGS. 13 and 14)

FIGS. 13 and 14 are plan views illustrating a holder 6c in an electromagnetic wave shield box according to a fourth preferred embodiment of the present invention. The fourth preferred embodiment is different from the first preferred embodiment in terms of the construction of the position indication means for indicating the position of a loading unit 50c disposed on a reference surface 31c. (In the first preferred embodiment, one of the alphabetic letters, which are arranged in a matrix, is revealed through the hole.) Other construction of the fourth preferred embodiment is substantially identical to that of the first preferred embodiment. Therefore, the fourth preferred embodiment will be described hereinafter in connection with the construction of the part different from the first preferred embodiment, and a description of the construction of the other parts, which are identical to that of the first preferred embodiment, will not be given by quoting the description of the first preferred embodiment.

As shown in FIGS. 13 and 14, according to this embodiment, guide means 80 having a linear guide surface is mounted at one side of the reference surface 31c. The guide means 80 may be a bar-shaped member mounted at the side of the reference surface 31c while the bar-shaped member is formed separately from a reference table 30c. Alternatively, the guide means 80 may be the inner surface of the box body 2 of the electromagnetic wave shield box. In this embodiment, one side of the loading unit 50c can contact the guide means 80, and the loading unit 50c can be linearly reciprocated on the reference surface 31c along the direction parallel with the guide surface of the guide means 80. Also, three locking holes 32, which serve as fixing means, are formed in the reference surface 31c of the reference table 30c. The locking holes 32 are arranged at predetermined intervals in a straight line, which is parallel with the guide direction of the guide means 80. A single fixing pin 33, which is fitted in a single through-hole of the loading unit 50c, can be selectively inserted into the locking holes 32, and therefore, it is possible to selectively set the loading unit 50c at three positions on the reference surface 31c. Two of the three positions are illustrated in FIGS. 13 and 14.

As shown in FIGS. 13 and 14, three alphabetic letters, A, B, and C, which serve as indication means, are provided on the reference surface 31c. The three alphabetic letters are arranged at predetermined intervals in a straight line, which is parallel with the guide direction of the guide means 80. In the case that the loading unit 50c is disposed at the position of FIG. 13, the letter A is revealed through the hole 60 of the loading unit 50c. In the case that the loading unit 50c is disposed at the position of FIG. 14, on the other hand, the letter C is revealed through the hole 60 of the loading unit 50c.

According to this embodiment, it is possible to select three positions using the common holder 6c. Also, when performing the position selecting operation, the loading unit 50c is moved only in one direction along the guide surface of the guide means 80, and therefore, the manipulation of the loading unit 50c is simple and easy. In addition, it is possible to find and select a plurality of positions, and therefore, it is possible to reveal alphabetic letters indicating the respective positions through the hole 60 of the loading unit 50c at the respective positions. Furthermore, only a single fixing pin 33 is necessary, and it is possible to specify many more positions by increasing the number and positions of the locking holes 32 and the kinds and positions of the alphabetic letters, which serve as the indication means.

5. Fifth Preferred Embodiment (FIGS. 15 to 19E)

FIG. 15 is a plan view illustrating a reference table 30d in an electromagnetic wave shield box according to a fifth preferred embodiment of the present invention, FIG. 16 is a plan view illustrating a loading unit 50d in the electromagnetic wave shield box according to the fifth preferred embodiment of the present invention, FIG. 17 is a perspective view illustrating the loading unit 50d in the electromagnetic wave shield box according to the fifth preferred embodiment of the present invention, FIGS. 18A to 18C are perspective views respectively illustrating a holder 6d, where a wireless terminal 5 is positioned at three different positions, in the electromagnetic wave shield box according to the fifth preferred embodiment of the present invention, and FIGS. 19A to 19E are plan views respectively illustrating the holder 6d, where the wireless terminal 5 is positioned at five different positions, in the electromagnetic wave shield box according to the fifth preferred embodiment of the present invention.

The fifth preferred embodiment is identical to the first preferred embodiment in that position indication means for indicating the position of the loading unit 50d disposed on a reference surface 31d is constructed such that one of alphabetic letters can be revealed through a hole. In the first preferred embodiment, however, the loading unit 50 is moved along the two linear directions, which are perpendicular to each other, on the reference surface 31d while the loading unit 50 is in parallel with the reference surface 31d, and then the loading unit 50 is positioned (first movement pattern—linear movement pattern). In the fifth preferred embodiment, on the other hand, a rotation-direction movement pattern, in which the loading unit 50d is moved in the rotating direction of the loading unit 50d, is also possible in addition to the above-mentioned movement pattern (second movement pattern—rotary movement pattern). More specifically, the loading unit 50d of the fifth preferred embodiment can be disposed at four different rotation-direction positions, which are arranged at intervals of 90 degrees, in the rotating direction of the loading unit 50d, when the loading unit 50d is seen from a certain point on the reference surface 31d. In the fifth preferred embodiment, the loading unit 50d can be moved in the rotary movement pattern, and then the position of the loading unit can be fixed, and furthermore, the respective position of the loading unit 50d is indicated by the position indication means in response to the movement of the loading unit in the rotary movement pattern, which is different from the first preferred embodiment. Other construction of the fifth preferred embodiment is substantially identical to that of the first preferred embodiment. Therefore, the fifth preferred embodiment will be described hereinafter in connection with the construction of the part different from the first preferred embodiment, and a description of the construction of the other parts, which are identical to that of the first preferred embodiment, will not be given by quoting the description of the first preferred embodiment and the related drawings.

In the receiving means of the electromagnetic wave shield box 1, which is constituted by the box body 2 and the cover 3, there is disposed a holder 6d (see FIGS. 19A to 19E), which is located above the coupling antenna 7 for positioning the wireless terminal 5, which is electromagnetically coupled with the coupling antenna 7.

The holder 6d includes a reference table 30d mounted, at the position where the holder 6d is spaced from the coupling antenna 7, in the receiving means. The reference table 30d has a reference surface 31d extending in the direction perpendicular to the main emission direction of the coupling antenna 7. Also, the loading unit 50d is disposed on the reference surface 31d such that the loading unit 50d can be moved along the reference surface 31d, and therefore, the loading unit 50d can be moved in the direction perpendicular to the main emission direction of the coupling antenna 7 while the wireless terminal 5 is loaded at the loading unit 50d. According to the above-described construction, the loading unit 50d is positioned with respect to the reference surface 31d such that the antenna of the wireless terminal 5 can be electromagnetically coupled to the coupling antenna 7 under the optimum condition.

As shown in the plan view of FIG. 15, locking holes 32 are formed approximately at the middle part of the reference surface 31d, which is the upper surface of the reference table 30d, such that the locking holes 32 are arranged in three vertical lines (11 locking holes for each vertical line) and in three horizontal lines (9 locking holes for each horizontal line). The locking holes 32 are arranged in a cross pattern approximately over the entire reference surface 31d. The total number of locking holes 32 amounts to 51 in consideration of the fact that the locking holes at the intersections of the cross-shaped lines are common. The loading unit 50d is fixed to the reference table 30d by means of fixing pins 33 and the locking holes 32, which together constitute fixing means, at a predetermined position on the reference surface 31d, at which the loading unit 50d is positioned according to the linear movement pattern and the rotary movement pattern.

As shown in FIG. 15, a total of 48 numeric-combined alphabetic letters 34, which indicate the position where the loading unit 50d is fixed, are provided at four corners of the reference surface 31d, which is formed in the shape of a rectangle such that the numeric-combined alphabetic letters 34 are arranged in two matrices of 3×3 (9 positions) and in two matrices of 5×3 (15 positions), i.e., at a total of 48 positions. In this embodiment, each numeric-combined alphabetic letter 34 is a combination of an Arabic numeral and an alphabetic letter. When the loading unit 50d is fixed to the reference surface 31d, one of these numeric-combined alphabetic letters 34 is revealed through a hole 60, which serves as position indication means, formed in the loading unit 50d. Consequently, the position where the loading unit 50d is disposed on the reference surface 31d is indicated by a specific numeric-combined alphabet.

As shown in the plan view of FIG. 16 and the perspective view of FIG. 17, the loading unit 50d has a plate part 51, which is formed in the shape of a rounded rectangle smaller than that of the reference table 30d, and holding means for holding the wireless terminal 5 on the plate part 51. The holding means includes a first positioning block 52d for holding one side of the wireless terminal 5, a second positioning block 53d having a step part, which holds one end of the wireless terminal 5, and a movable fixing block 55d for pushing the other side of the wireless terminal 5, such that the wireless terminal 5 can contact the first positioning block 52d and the second positioning block 53d, to position the wireless terminal 5. The movable fixing block 55d is formed in the shape of a rectangular parallelepiped. To the fixing block 55d is connected one end of a rubber band 56d, which serves as an elastic member. The rubber band 56d is disposed in a groove 57d formed at the plate part 51 such that the groove 57 extends along the direction perpendicular to the longitudinal direction of the wireless terminal 5. Also, the rubber band 56d is inserted through a stopper structure (not shown in detail), which is mounted in the groove 57d, and the other end of the rubber band 56d is withdrawn to the outsides of the first positioning block 52d and the second positioning block 53d. Consequently, the position of the fixing block 55 can be adjusted depending upon the size of the wireless terminal. Also, these blocks 52d, 53d, and 55d may be made of polyethylene-based foam material or urethane-based foam material.

As shown in FIG. 16, through-holes 59 are formed at two predetermined positions of the plate part 51, and fixing pins 33 are inserted in the through-holes 59, respectively. The tip ends of the fixing pins 33 protrude under the plate part 51. The through-holes 59 and the fixing pins 33, together with the plurality of locking holes 32 formed at the reference table 30d, constitute fixing means for detachably fixing the loading unit 50d, at which the wireless terminal 5 is loaded, to a predetermined position of the reference surface 31d of the reference table 30d.

As shown in FIGS. 16 and 17, a hole 60, which serves as a specifying part for specifying one of the numeric-combined alphabetic letters 34, is formed in one corner of the plate part 51, which corresponds to the numeric-combined alphabetic letters 34 provided on the reference surface 31d. The hole 60, together with the numeric-combined alphabetic letters 34 provided on the reference surface 31d, constitutes position indication means for indicating the position of the loading unit 50d disposed on the reference surface 31d. Specifically, when the loading unit 50d is disposed at any one of the specific rotation-direction positions (in this embodiment, four positions arranged at intervals of 90 degrees in the rotating direction of the loading unit 50d) at a specific position on the reference surface 31d, a specific one of the grouped numeric-combined alphabetic letters 34 provided at the four corners of the reference surface 31d is revealed through the hole 60. Consequently, the position of the loading unit 50d on the reference surface 31d and the corresponding rotation-direction position of the loading unit 50d can be indicated by the combination of the Arabic numeral and the alphabet. Alternatively, it is possible to find the position of the loading unit 50d at which a specific one of the numeric-combined alphabetic letters is revealed through the hole 60 and then to fix the loading unit 50d to the reference table 30d by means of the fixing pins 33.

As shown in FIG. 18A, the loading unit 50d is positioned and fixed on the reference table 30d. In the case that this position is the reference position, the position shown in FIG. 18B is obtained by moving the loading unit 50d in the right and downward direction from the position of FIG. 18A, while the loading unit 50d is parallel with the reference table 30d, not by moving the loading unit 50d in the rotating direction of the loading unit 50d. In the case that the position of FIG. 18A is the reference position, on the other hand, the position shown in FIG. 18C is obtained by moving the loading unit 50d in the left and downward direction from the position of FIG. 18A, while the loading unit 50d is parallel with the reference table 30d, and by rotating the loading unit 50d 90 degrees in the clockwise direction. In the FIGS. 18A, 18B, and 18C, the positional relations between the wireless terminal 5 and the coupling antenna 7 are different.

FIGS. 19A, 19B, and 19C are plan views corresponding to FIGS. 18A, 18B, and 18C, respectively. The numeric-combined alphabetic letters 34 revealed through the hole 60 to indicate the positions of the loading unit 50d are 1E, 1A, and 2G, respectively.

In the case that the position of FIG. 19C is the reference position, the position shown in FIG. 19D is obtained by moving the loading unit 50d in the left and upward direction from the position of FIG. 19C, while the loading unit 50d is parallel with the reference table 30d, and by rotating the loading unit 50d 90 degrees in the clockwise direction. The numeric-combined alphabetic letter 34 revealed through the hole 60 to indicate the position of the loading unit 50d is 3O.

In the case that the position of FIG. 19D is the reference position, the position shown in FIG. 19E is obtained by moving the loading unit 50d in the right direction from the position of FIG. 19D, while the loading unit 50d is parallel with the reference table 30d, and by rotating the loading unit 50d 90 degrees in the clockwise direction. The numeric-combined alphabetic letter 34 revealed through the hole 60 to indicate the position of the loading unit 50d is 4C.

Once the optimum position is decided by finding the optimum position while a test is performed to a certain type of wireless terminal 5 using a tester, it is possible to easily reset the optimum position while targeting a specific numeric-combined alphabetic letter (for example, "1E" at the position of FIG. 19A) of the reference surface 31d, which is revealed through the hole 60 of the loading unit 50d, when this type of wireless terminal is tested again, since it is determined that the optimum position is the position indicated by the numeric-combined alphabetic letter "1E".

Also, in this embodiment, since the positioning operation of the loading unit 50d on the reference table 30d is performed by a combination of the linear movement and the rotation-direction movement of the loading unit 50d, the number of selectable placements (the number of numeric-combined alphabetic letters to indicate positions) is 48, which is larger than the number, 15, for the first preferred embodiment, in which only the linear movement is possible. Consequently, the scope of selection is wider in this embodiment.

In the respective embodiment as described above, the structure for holding the wireless terminal 5, 5a on the loading unit 50, 50b, 50c, 50d is constructed using the positioning blocks 52 to 54, 52d, 53d and fixing block 55, 55d. However, the holding structure is not particularly restricted so long as the wireless terminal 5, 5a can be fixed to the loading unit 50, 50b, 50c, 50d within a certain degree of freedom. In the case that the wireless terminal is fixed to the loading unit irrespective of the fixing structure of the wireless terminal itself, and then the loading unit is appropriately positioned on the reference table, it is possible to find out the optimum positional relation between the wireless terminal and the coupling antenna. In the case that this process is carried out for each type of wireless terminal, it is possible to perform the test of various types of wireless terminals, the positions of inner antennas of which are different, using only one type of electromagnetic wave shield box.

As apparent from the above description, the electromagnetic wave shield box 1 according to the respective embodiments of the present invention has an effect in that it is possible to move the loading unit 50, 50b, 50c, 50d, on which the wireless terminal 5, 5a is loaded, along the reference surface 31, 31a, 31b, 31c, 31d of the reference table 30, 30a, 30b, 30c, 30d, such that the wireless terminal 5, 5a can be tested at different positions, to find out the position of the loading unit 50, 50b, 50c, 50d, at which the positional relation between the antenna of the wireless terminal 5, 5a and the coupling antenna 7 in the box body 2 is optimum, and to fix the loading unit 50, 50b, 50c, 50d to the reference surface 31, 31a, 31b, 31c, 31d by means of the fixing means (the fixing pins 33) at the optimum position. It is possible to record the positional relation between the loading unit 50, 50b, 50c, 50d and the reference surface 31, 31a, 31b, 31c, 31d for various types of wireless terminals 5, 5a, the positions of inner antennas of which are different. In this case, when a certain type of wireless terminal 5, 5a is tested, a specific positional relation for this type of wireless terminal can be set to the positional relation between the loading unit 50, 50b, 50c, 50d and the reference surface 31, 31a, 31b, 31c, 31d, and therefore, it is possible to immediately obtain the optimum test condition for this type of wireless terminal. Consequently, it is possible to perform the test of various types of wireless terminals 5, 5a, the positions of inner antennas of which are different, using only a single electromagnetic wave shield box 1.

Also, the electromagnetic wave shield box 1 according to the respective embodiments of the present invention has an effect in that the positional relation between the loading unit 50, 50b, 50c, 50d and the reference table 30, 30a, 30b, 30c, 30d can be indicated by the position indication means. Specifically, the specific position, i.e., the indication part (the alphabetic letter or the numeric-combined alphabetic letter 34, the coordinate 70) on the reference table 30, 30a, 30b, 30c, 30d is indicated by the specific part (the hole 60) of the loading unit 50, 50b, 50c, 50d, which is disposed at the specific position on the reference surface 31, 31a, 31b, 31c, 31d, whereby it is possible to obviously indicate that the loading unit 50, 50b, 50c, 50d and the reference table 30, 30a, 30b, 30c, 30d are on the specific positional relation. In the case that the loading unit 50, 50b, 50c, 50d is set to the reference table 30, 30a, 30b, 30c, 30d according to the type of wireless terminal 5, 5a to be tested, it is possible to move the loading unit 50, 50b, 50c, 50d, while viewing the specific part of the indication part (the alphabetic letter or the numeric-combined alphabetic letter 34, the coordinate 70) specified on the reference table 30, 30a, 30b, 30c, 30d by means of the position indication means (the hole 60, the alphabetic letter or the numeric-combined alphabetic letter 34, the coordinate 70), to find the corresponding position, and to fix the loading unit 50, 50b, 50c, 50d to the reference table 30, 30a, 30b, 30c, 30d at the found position.

Also, the electromagnetic wave shield box 1 according to the respective embodiments of the present invention has an effect in that, since the positional relation between the reference surface 31, 31a, 31b, 31c, 31d and the loading unit 50, 50b, 50c, 50d corresponds to the symbol (the alphabetic letter or the numeric-combined alphabetic letter 34) on the reference surface 31, 31a, 31b, 31c, 31d, which is revealed through the hole 60 of the loading unit 50, 50b, 50c, 50d, it is possible to move the loading unit 50, 50b, 50c, 50d while targeting the symbol (the alphabetic letter or the numeric-combined alphabetic letter 34) revealed through the hole 60 to find out a specific position on the reference surface 31, 31a, 31b, 31c, 31d, and then to fix the loading unit 50, 50b, 50c, 50d to the reference surface 31, 31a, 31b, 31c, 31d at the position. Consequently, it is possible to obtain a specific position of the loading unit 50, 50b, 50c, 50d corresponding to a certain type of wireless terminal 5, 5a. When the wireless terminal 5, 5a is loaded on the loading unit 50, 50b, 50c, 50d fixed at the specific position in a predetermined posture, the antenna of the wireless terminal 5, 5a can be coupled with the coupling antenna 7 of the box body 2 under the optimum condition.

Also, the electromagnetic wave shield box 1 according to the second preferred embodiments of the present invention has an effect in that, since the positional relation between the reference surface 31, 31a, 31b, 31c, 31d and the loading unit 50, 50b, 50c, 50d corresponds to the coordinate axis 70 on the reference surface 31, 31a, 31b, 31c, 31d, which is indicated by the outer appearance of the loading unit 50, 50b, 50c, 50d disposed on the reference surface 31, 31a, 31b, 31c, 31d, it is possible to move the loading unit 50, 50b, 50c, 50d while targeting coordinate axis 70 indicated by the outer appearance of the loading unit 50, 50b, 50c, 50d to find out a specific position on the reference surface 31, 31a, 31b, 31c, 31d, and then to fix the loading unit 50, 50b, 50c, 50d to the reference surface 31, 31a, 31b, 31c, 31d at the position. Consequently, it is possible to obtain a specific position of the loading unit 50, 50b, 50c, 50d corresponding to a certain type of wireless terminal 5, 5a. When the wireless terminal 5, 5a is loaded on the loading unit 50, 50b, 50c, 50d fixed at the specific position in a predetermined posture, the antenna of the wireless terminal 5, 5a can be coupled with the coupling antenna 7 of the box body 2 under the optimum condition.

Also, the electromagnetic wave shield box 1 according to the respective embodiments of the present invention has an effect in that the fixing pins 33 are inserted into the locking holes 32 of the reference surface 31, 31a, 31b, 31c, 31d through the through-holes 59 of the loading unit 50, 50b, 50c, 50d, and therefore, it is possible to fix the loading unit 50, 50b, 50c, 50d to the reference surface 31, 31a, 31b, 31c, 31d at a desired position. Consequently, it is possible easily change the position of the loading unit 50, 50b, 50c, 50d.

Also, the electromagnetic wave shield box 1 according to the third preferred embodiments of the present invention has an effect in that the loading unit 50, 50b, 50c, 50d is moved along the two linear directions, which are perpendicular to each other, on the reference surface 31, 31a, 31b, 31c, 31d such that the loading unit 50, 50b, 50c, 50d can be positioned, and furthermore, the loading unit 50, 50b, 50c, 50d is moved in the rotating direction of the loading unit 50, 50b, 50c, 50d on the reference surface 31, 31a, 31b, 31c, 31d such that the loading unit 50, 50b, 50c, 50d can be positioned.

Also, the electromagnetic wave shield box 1 according to the respective embodiments of the present invention has an effect in that it is possible to move the loading unit 50, 50b, 50c, 50d, on which the wireless terminal 5, 5a is loaded, along the reference surface 31, 31a, 31b, 31c, 31d, which is the plane perpendicular to the main emission direction of the coupling antenna 7, such that the wireless terminal 5, 5a can be tested at a plurality of different positions, to find out the position of the loading unit 50, 50b, 50c, 50d, at which the positional relation between the antenna of the wireless terminal 5, 5a and the coupling antenna 7 in the box body 2 is optimum, and to obtain the optimum test condition for the corresponding type of wireless terminal by positioning the loading unit 50, 50b, 50c, 50d at the position. It is possible to record the positional relation between the loading unit 50, 50b, 50c, 50d and the reference surface 31, 31a, 31b, 31c, 31d for various types of wireless terminals 5, 5a, the positions of inner antennas of which are different. In this case, when a certain type of wireless terminal 5, 5a is tested, a specific positional relation for this type of wireless terminal can be set to the positional relation between the loading unit 50, 50b, 50c, 50d and the reference surface 31, 31a, 31b, 31c, 31d, and therefore, it is possible to immediately obtain the optimum test condition for this type of wireless terminal. Consequently, it is possible to perform the testing of various types of wireless terminals 5, 5a, the positions of inner antennas of which are different, using only the single electromagnetic wave shield box 1.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An electromagnetic wave shield box for shielding a wireless terminal received therein from external electromagnetic waves, the electromagnetic wave shield box comprising:
   a box body for allowing the wireless terminal to be received therein, the box body having a coupling antenna mounted therein, the coupling antenna being spatially coupled with an antenna of the wireless terminal;
   a cover constructed to be openable and closable with respect to the box body;
   a reference table mounted at a predetermined position above the coupling antenna in the box body, the reference table having a reference surface, which is referenced when the wireless terminal is disposed thereon;
   a loading unit for allowing the wireless terminal to be loaded thereon, the loading unit being movable along the reference surface; and
   fixing means for detachably fixing the loading unit, on which the wireless terminal is loaded, to a predetermined position of the reference surface of the reference table to define the positional relation between the antenna of the wireless terminal and the coupling antenna.

2. The electromagnetic wave shield box according to claim 1, further comprising:
   position indication means for indicating the position of the loading unit disposed on the reference surface, the position indication means being constituted by an indication part provided at the reference table and a specifying part provided at the loading unit for indicating a specific position of the indication part.

3. The electromagnetic wave shield box according to claim 2,
   wherein the indication part is a plurality of symbols provided on the reference surface, and
   the specifying part is a hole formed in the loading unit for allowing at least one of the symbols to be revealed therethrough.

4. The electromagnetic wave shield box according to claim 2, wherein
   the indication part is a coordinate axis having a plurality of straight lines provided on the reference surface, while the straight lines are arranged at predetermined intervals along directions in which the loading unit is moved on the reference surface such that the loading unit is positioned, and symbols for indicating the respective straight lines, and
   the specifying part is at least a part of the outer appearance of the loading unit, which is disposed along the straight lines in the case that the loading unit is disposed at the reference surface.

5. The electromagnetic wave shield box according to claim 1, wherein the fixing means includes locking holes formed at the reference surface of the reference table, through-holes formed at the loading unit, and fixing pins removably inserted into the locking holes through the through-holes for fixing the loading unit to the reference surface.

6. The electromagnetic wave shield box according to claim 3, wherein the loading unit is movable in a first movement pattern, in which the loading unit can be moved in a first linear direction extending along the reference surface and in a second linear direction perpendicular to the first linear direction, the second linear direction also extending along the reference surface, and/or in a second movement pattern, in which the loading unit can be moved in a rotating direction of the loading unit along the reference surface.

7. An electromagnetic wave shield box for shielding a wireless terminal received therein from external electromagnetic waves, the electromagnetic wave shield box comprising:
   receiving means for receiving the wireless terminal to be tested therein, the receiving means having a coupling antenna mounted therein, the coupling antenna being electromagnetically coupled with an antenna of the wireless terminal;
   a reference surface disposed at a predetermined position, where the reference surface is spaced apart from the coupling antenna, in the receiving means such that the reference surface extends in a direction perpendicular to a main emission direction of the coupling antenna; and
   a loading unit for allowing the wireless terminal to be loaded thereon, the loading unit being movable along the reference surface such that the loading unit can be moved in the direction perpendicular to the main emission direction of the coupling antenna,
   wherein the loading unit is positioned with respect to the reference surface such that the antenna of the wireless terminal and the coupling antenna can be electromagnetically coupled with each other under the optimum condition.

* * * * *